(12) United States Patent
Nasu et al.

(10) Patent No.: US 6,756,621 B2
(45) Date of Patent: Jun. 29, 2004

(54) FERROELECTRIC CAPACITOR DEVICE

(75) Inventors: Toru Nasu, Kyoto (JP); Shinichiro Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/330,160

(22) Filed: Dec. 30, 2002

(65) Prior Publication Data
US 2004/0104414 A1 Jun. 3, 2004

(30) Foreign Application Priority Data
Feb. 12, 2002 (JP) ........................................ 2002-033398

(51) Int. Cl.⁷ ............................................ H01L 31/119
(52) U.S. Cl. ........................ 257/295; 257/295; 257/296
(58) Field of Search ................................. 257/295, 300, 257/303, 310, 324, 296, 532; 361/34.1; 106/287.18

(56) References Cited

U.S. PATENT DOCUMENTS

| 5,426,075 A | * | 6/1995 | Perino et al. ................. 438/3 |
| 5,955,754 A | | 9/1999 | Azuma et al. |
| 6,080,592 A | * | 6/2000 | Paz de Araujo et al. ........ 438/3 |
| 6,172,385 B1 | * | 1/2001 | Duncombe et al. ......... 257/295 |
| 6,407,435 B1 | * | 6/2002 | Ma et al. .................... 257/411 |

FOREIGN PATENT DOCUMENTS

JP  9-213905  8/1997

* cited by examiner

Primary Examiner—David Nelms
Assistant Examiner—Thinh T Nguyen
(74) Attorney, Agent, or Firm—McDermott, Will & Emery

(57) ABSTRACT

The ferroelectric capacitor device includes a bottom electrode, a capacitor insulating film formed of a ferroelectric film, and a top electrode. The ferroelectric film has a bismuth layer structure including a plurality of bismuth oxide layers and a plurality of perovskite-like layers alternately put on top of each other. The plurality of bismuth oxide layers are formed of $Bi_2O_2$, and the plurality of perovskite-like layers include two or more kinds of layers represented by a general formula: $A_{m-1}B_mO_{3m+\alpha}$ (where A is a univalent, divalent or trivalent metal, B is a tetravalent, pentavalent or hexavalent metal, m is an integer equal to or more than 1, at least one of A being Bi if m is an integer of 2 or more, and $0 \leq \alpha \leq 1$) and different in the value of m.

14 Claims, 16 Drawing Sheets

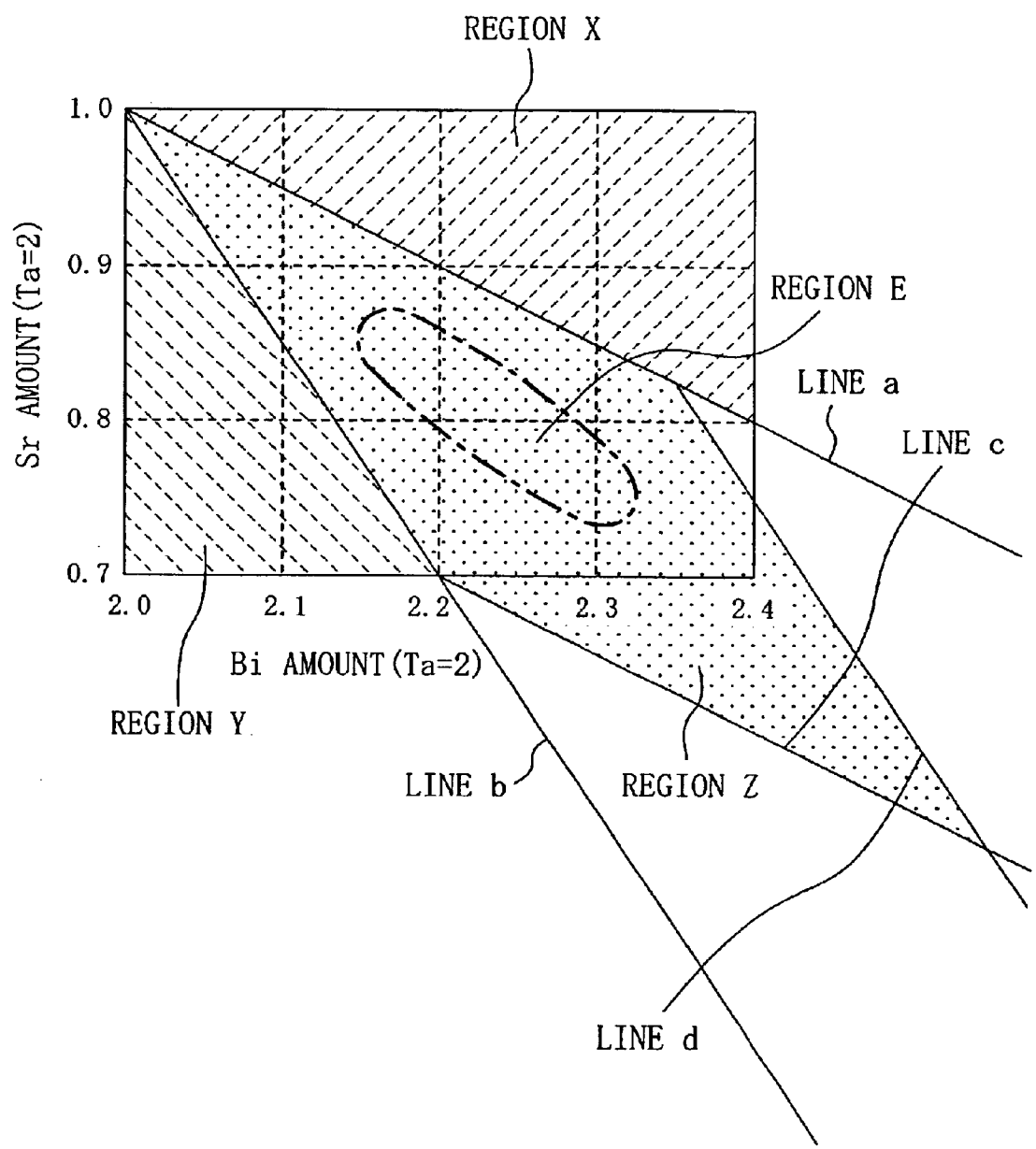

FERROELECTRIC CAPACITOR DEVICE

BACKGROUND OF THE INVENTION

The present invention relates to a ferroelectric capacitor device including a ferroelectric film having a bismuth layer structure as a capacitor insulating film.

In recent years, with the advance of digital technology, the tendency to process and store a massive amount of data has been accelerated. In this situation, electronic equipment has been further sophisticated, and rapid progress has been made in increasing the integration of semiconductor integrated circuit devices used for electronic equipment and attaining finer semiconductor elements.

To realize higher integration of dynamic random access memories (RAMs), there has been widely researched and developed a technology of using a dielectric having a high dielectric constant (hereinafter, simply called a high dielectric) as a capacitor film of a memory capacitor device, in place of a silicon oxide or a silicon nitride conventionally used.

Research and development have also been vigorous on ferroelectric films having the spontaneous polarization property, with the aim of commercializing a nonvolatile RAM that can operate at a lower voltage than is conventionally allowed and permit write/read at a high speed.

As a ferroelectric film used for a nonvolatile RAM, promising is a ferroelectric film having a bismuth layer structure, which is excellent in rewrite endurance and can operate at a low voltage. In general, a bismuth layer structure is represented by chemical formula (a):

$$(Bi_2O_2)(A_{m-1}B_mO_{3m+1}) \quad (a)$$

where m is an integer equal to or more than 1, A is a univalent, divalent or trivalent metal, and B is a tetravalent, pentavalent or hexavalent metal.

The above bismuth layer structure includes bismuth oxide layers ($Bi_2O_2$) and perovskite-like layers ($A_{m-1}B_mO_{3m+1}$) alternately put on top of each other.

Among a group of materials having the bismuth layer structure, a material called SBT, in particular, is often used for nonvolatile memories.

The SBT is a compound represented by chemical formula (b):

$$(Bi_2O_2)(SrTa_2O_7) \quad (b),$$

that is, m is 2, A is divalent Sr, and B is pentavalent Ta in chemical formula (a) above (hereinafter, this compound is called a normal type).

The laminated structure of the compound is as shown in FIG. 15, in which bismuth oxide layers 101 and perovskite-like layers 102 (m=2) are alternately put on top of each other.

The bismuth oxide layer 101 (chemical formula: $Bi_2O_2$) has a structure as shown in FIG. 16, in which square pyramids linked to one another extend two-dimensionally. Bismuth 111 exists at the apex of each square pyramid, and oxygen 112 exists at each corner of the bottom square of the square pyramid.

The m=2 perovskite-like layer 102 (chemical formula: $SrTa_2O_7$) has a layer structure as shown in FIG. 17, in which oxygen octahedra extend two-dimensionally with each two placed one upon the other vertically. Tantalum 113 exists in the B site as the center of each oxygen octahedron, and oxygen 112 exists at each apex of the oxygen octahedron. Strontium 114 exists in the A site as a space surrounded by the oxygen octahedra.

The SBT has problems to be tackled. The first problem is improving the spontaneous polarization amount, and the second problem is suppressing the leakage current and improving the breakdown voltage. As methods for improving the spontaneous polarization as the first problem, the following two crystal structures (a mixed layered superlattice type and an A-site Bi substitution type) have been proposed.

(1) Mixed layered superlattice type layer structure (first prior art)

The layer structure of this type is disclosed in U.S. Pat. No. 5,955,754 to Azuma et al. This literature describes extensively the entire of the layer structure. Herein, however, the disclosed layer structure will be described as being applied to SBT according to the purport of the present invention. As shown in FIG. 18, the mixed layered superlattice type layer structure (this is not a commonly-accepted name but is called herein for convenience to distinguish from other structures) includes either a perovskite-like layer 102 (m=2) or a perovskite-like layer 103 (m=1) interposed between every two adjacent bismuth oxide layers 101. When the existence probability of the m=1 perovskite-like layer 103 is δ (0<δ<1), the existence probability of the m=2 perovskite-like layer 102 is 1−δ.

The m=1 perovskite layer 103, represented by $TaO_4$, has a layer structure as shown in FIG. 19, in which a single layer of oxygen octahedra having tantalum 113 as the center extends two-dimensionally. The tantalum 113 exists in the B site as the center of each oxygen octahedron, and oxygen 112 exists at each apex of the oxygen octahedron. If valence calculation is made strictly, the chemical formula should be $TaO_{7/2}$, indicating that the oxygen amount is short to form the structure shown in FIG. 19. A vacancy is therefore formed in an oxygen-lacking portion.

The feature of the mixed layered superlattice is that because the amount of bismuth having a low melting point is large compared with the normal structure, crystal grains can be easily grown large, and this can improve the spontaneous polarization property.

(2) A-site Bi substitution type layer structure (second prior art)

The layer structure of this type, disclosed in Japanese Laid-Open Patent Publication No. 9-213905 to Atsugi et al., is represented by chemical formula (c):

$$(Bi_2O_2)[(Sr_{1-x}Bi_x)Ta_2O_7] \quad (c)$$

The A-site Bi substitution type layer structure includes the bismuth oxide layers 101 and the m=2 perovskite-like layers 102 alternately put on top of each other as shown in FIG. 15.

The bismuth oxide layer 101, represented by chemical formula: $Bi_2O_2$, has the structure shown in FIG. 16 as in the normal type.

The m=2 perovskite-like layer 102, represented by chemical formula: $(Sr_{1-x}Bi_x)Ta_2O_7$, has a structure shown in FIG. 20. The structure shown in FIG. 20 resembles the structure shown in FIG. 17, in which tantalum 113 exists in the B site as the center of each oxygen octahedron, and oxygen 112 exists at each apex of the oxygen octahedron. The difference is that the A site 115 is occupied by Sr with a probability of (1−x) or Bi with a probability of x. That is, while all the A sites 115 are occupied by Sr in the normal type, Bi substitutes for Sr in the A sites 115 with a probability of x.

In a recent research, formation of a vacancy in the A site 115 has been confirmed. The reason is that since trivalent Bi substitutes for divalent Sr, a vacancy is formed to satisfy the charge neutrality law. In this case, chemical formula (c) is changed to chemical formula (d):

$$(Bi_2O_2)[(Sr_{1-x}Bi_{2x/3})Ta_2O_7] \quad (d)$$

Thus, in the A-site Bi substitution type, the m=2 perovskite-like layer 102 is represented by chemical formula: $(Sr_{1-x}Bi_{2x/3})Ta_2O_7$, where the A site shown in FIG. 20 is occupied by Sr with a probability of (1−x), Bi with a probability of (2x/3), or a vacancy with a probability of (x/3).

The feature of the A-site Bi substitution type is that since $Bi^{3+}$ small in ion radius substitutes for $Sr^{2+}$ in the A site 115, the lattice distortion increases, and this increases the spontaneous polarization amount. In addition, as in the mixed layered superlattice type, since the amount of Bi having a low melting point is large compared with the normal type, crystal grains can be easily grown large, and this can improve the spontaneous polarization property.

As described above, the first and second prior art structures can solve the first problem of SBT of improving the spontaneous polarization.

However, the first and second prior art structures fail to solve the second problem of SBT of reducing the leakage current and improving the breakdown voltage, for the following reason.

The first and second prior art structures cause generation of a precipitation at grain boundaries and the electrode interfaces. Specifically, a precipitation of Bi is generated in the mixed layered superlattice type layer structure of the first prior art, and a precipitation of $BiTaO_4$ is generated in the A-site Bi substitution type layer structure of the second prior art. The precipitation acts as a leak path at grain boundaries resulting in increase of the leakage current, and lowers a Schottky barrier at the electrode interfaces causing decrease of the breakdown voltage.

As described above, the first and second prior art structures have the problem that they fail to obtain a capacitor device having the degree of reliability required for commercialization because the ferroelectric films used are prone to cause increase in leakage current and decrease in breakdown voltage.

SUMMARY OF THE INVENTION

An object of the present invention is providing a ferroelectric capacitor device including a ferroelectric film having a bismuth layer structure as a capacitor insulating film, capable of preventing occurrence of a failure due to increase in leakage current and decrease in breakdown voltage.

To attain the object described above, the present invention adopts a structure combining the mixed layered superlattice type and the A-site Bi substitution type to realize a ferroelectric film having a bismuth layer structure free from generation of a precipitation.

The first ferroelectric capacitor device of the present invention includes a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers includes two or more kinds of layers represented by general formula (1): $A_{m-1}B_mO_{3m+\alpha}$ (where A is a univalent, divalent or trivalent metal, B is a tetravalent; pentavalent or hexavalent metal in is an integer equal to or more than 1, at least one of A being Bi if in is an integer equal to or more than 2, and $0 \leq \alpha \leq 1$) and different in the value of m from each other.

According to the first ferroelectric capacitor device, a ferroelectric film having a bismuth layer structure free from generation of a precipitation can be obtained as the capacitor insulating film Therefore, the ferroelectric capacitor device is prevented from occurrence of a failure due to increase in leakage current or decrease in breakdown voltage.

The second ferroelectric capacitor device of the present invention includes a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (2): $BO_{3+\alpha}$ (where B is a tetravalent, pentavalent or hexavalent metal and $0 \leq \alpha \leq 1$) and at least one second layer represented by general formula (3): $A_{m-1}B_mO_{3m+1}$ (where A is a univalent, divalent or trivalent metal, and m is an integer equal to or more than 2, at least one of A being Bi).

According to the second ferroelectric capacitor device, a ferroelectric film having a bismuth layer structure free from generation of a precipitation can be obtained as the capacitor insulating film. Therefore, the ferroelectric capacitor device is prevented from occurrence of a failure due to increase in leakage current or decrease in breakdown voltage.

The third ferroelectric capacitor device of the present invention includes a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (4): $BO_{7/2}$ (where B is a pentavalent metal) and at least one second layer represented by general formula (5): $(A_{1-x}Bi_{2x/3})B_2O_7$ (where A is a divalent metal, B is a pentavalent metal, and 0<x<1).

According to the third ferroelectric capacitor device, a ferroelectric film having a bismuth layer structure free from generation of a precipitation can be obtained as the capacitor insulating film. Therefore, the ferroelectric capacitor device is prevented from occurrence of a failure due to increase in leakage current or decrease in breakdown voltage.

Preferably, in the general formulae (4) and (5) of the third ferroelectric capacitor device, A is Sr, B is $Ta_{1-y}Nb_y$ (where $0 \leq y \leq 1$).

By the above setting, a ferroelectric film excellent in fatigue characteristic can be used as the capacitor insulating film. This makes it possible to provide a ferroelectric capacitor device excellent in rewrite endurance.

In the third ferroelectric capacitor device, preferably, the proportion of the first layer in the plurality of perovskite-like layers is greater than 0 and smaller than 0.3, and 0<x<0.3 in the general formula (5).

By the above setting, generation of a precipitation can be suppressed substantially completely. This ensures the prevention of the ferroelectric capacitor device from occurrence of a failure due to increase in leakage current or decrease in breakdown voltage.

The fourth ferroelectric capacitor device of the present invention includes a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (6): $B^1O_{7/2}$ (where $B^1$ is a pentavalent metal) and at least one second layer represented by general formula (7): $(A_{1-x}Bi_x)B^1{}_{2-x}B^2{}_xO_7$ (where A is a divalent metal, $B^1$ is a pentavalent metal, $B^2$ is a tetravalent metal, and 0<x<1).

According to the fourth ferroelectric capacitor device, a ferroelectric film having a bismuth layer structure free from generation of a precipitation can be obtained as the capacitor insulating film. Therefore, the ferroelectric capacitor device is prevented from occurrence of a failure due to increase in leakage current or decrease in breakdown voltage. In addition, since formation of a vacancy in the A site can be suppressed, degradation of reliability such as rewrite endurance can be prevented.

Preferably, in the general formulae (6) and (7) of the fourth ferroelectric capacitor device, A is Sr, $B^1$ is $Ta_{1-y}Nb_y$ (where $0 \leq y \leq 1$), and $B^2$ is Ti.

By the above setting, a ferroelectric film excellent in fatigue characteristic can be obtained. This makes it possible to provide a ferroelectric capacitor device excellent in rewrite endurance.

In the fourth ferroelectric capacitor device, preferably, the proportion of the first layer in the plurality of perovskite-like layers is greater than 0 and smaller than 0.3, and 0<x<0.3 in the general formula (7).

By the above setting, generation of a precipitation can be suppressed substantially completely. This ensures the prevention of the ferroelectric capacitor device from occurrence of a failure due to increase in leakage current or decrease in breakdown voltage.

The fifth ferroelectric capacitor device of the present invention includes a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (8): $BO_3$ (where B is a tetravalent metal) and at least one second layer represented by general formula (9): $(A_{1-x}Bi_x)_2B_3O_{10}$ (where A is a trivalent metal, B is a tetravalent metal, and 0<x<1).

According to the fifth ferroelectric capacitor device, a ferroelectric film having a bismuth layer structure free from generation of a precipitation can be obtained as the capacitor insulating film. Therefore, the ferroelectric capacitor device is prevented from occurrence of a failure due to increase in leakage current or decrease in breakdown voltage.

Preferably, in the general formulae (8) and (9) of the fifth ferroelectric capacitor device, A is a lanthanoide such as La, Ce, Pr, Nd, Pm, Sm, Eu, Gd, Tb, Dy, Ho, Er, Tm, Yb or Lu, and B is Ti.

By the above setting, a ferroelectric film excellent in fatigue characteristic can be obtained. This makes it possible to provide a ferroelectric capacitor device excellent in rewrite endurance.

In the fifth ferroelectric capacitor device, preferably, the proportion of the first layer in the plurality of perovskite-like layers is greater than 0 and smaller than 0.3.

By the above setting, generation of a precipitation can be suppressed substantially completely. This ensures the prevention of the ferroelectric capacitor device from occurrence of a failure due to increase in leakage current or decrease in breakdown voltage.

The sixth ferroelectric capacitor device of the present invention includes a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (10): $(A_{1-x}Bi_x)B_2O_7$ (where A is a trivalent metal, B is a tetravalent metal, and 0<x<1) and at least one second layer represented by general formula (11): $(A_{1-x}Bi_x)_2B_3O_{10}$ (where A is a trivalent metal, B is a tetravalent metal, and 0<x<1).

According to the sixth ferroelectric capacitor device, a ferroelectric film having a bismuth layer structure free from generation of a precipitation can be obtained as the capacitor insulating film. Therefore, the ferroelectric capacitor device is prevented from occurrence of a failure due to increase in leakage current or decrease in breakdown voltage.

Preferably, in the general formulae (10) and (11) of the sixth ferroelectric capacitor device, A is a lanthanoide such as La, Ce, Pr, Nd, Pm, Sm, Eu, Gd, Tb, Dy, Ho, Er, Tm, Yb or Lu, and B is Ti.

By the above setting, a ferroelectric film excellent in fatigue characteristic can be obtained. This makes it possible to provide a ferroelectric capacitor device excellent in rewrite endurance.

In the sixth ferroelectric capacitor device, preferably, the proportion of the first layer in the plurality of perovskite-like layers is greater than 0 and smaller than 0.3.

By the above setting, generation of a precipitation can be suppressed substantially completely. This ensures the prevention of the ferroelectric capacitor device from occurrence of a failure due to increase in leakage current or decrease in breakdown voltage.

BRIEF DESCRIPTION OF THE DRAWINGS

FIG. 12 is a view showing the relationship between the amounts of bismuth and strontium and the regions free from generation of a precipitation in the ferroelectric capacitor device of Embodiment 1.

DESCRIPTION OF THE PREFERRED EMBODIMENTS

Hereinafter, the cross-sectional structure of the ferroelectric capacitor device common to the embodiments of the present invention will be described with reference to FIG. 1.

Figure 1:
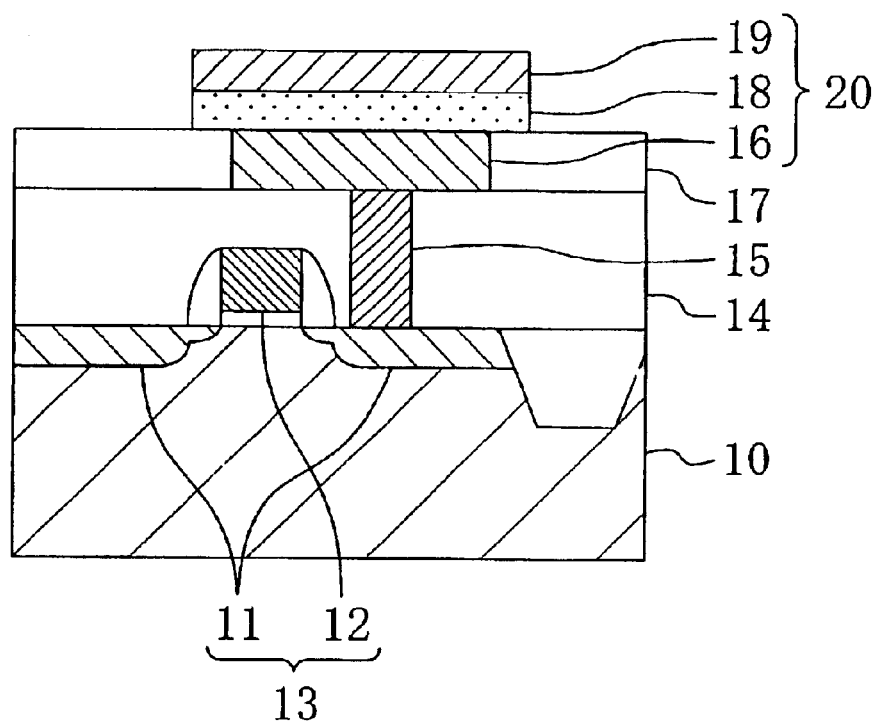
FIG. 1 is a cross-sectional view of a ferroelectric capacitor device of embodiments of the present invention.

Referring to FIG. 1, impurity diffusion regions 11 to be used as source and drain regions are formed in a surface portion of a semiconductor substrate 10. A gate electrode 12 is formed on the semiconductor substrate 10 via a gate insulating film. The impurity diffusion regions 11 and the gate electrode 12 constitute a field effect transistor 13.

An interlayer insulating film 14 is precipitated on the semiconductor substrate 10 covering the field effect transistor 13. A contact plug 15 made of tungsten is embedded through the interlayer insulating film 14 so that the bottom end thereof is in contact with the impurity diffusion region 11.

A bottom electrode 16 is formed on the interlayer insulating film 14 so as to be in contact with the top end of the contact plug 15. The bottom electrode 16 is composed of a Pt layer (thickness: 50 nm), an $IrO_2$ layer (thickness: 50 nm), an Ir layer (thickness: 100 nm) and a TiAlN layer (thickness: 40 nm) in the order from top.

A spacer 17, formed of a silicon oxide film, covers the exposed portion of the interlayer insulating film 14 on which the bottom electrode 16 is not formed.

A capacitor insulating film 18, formed of a ferroelectric film having a thickness of 100 nm, is placed to cover the entire surface of the bottom electrode 16 and a portion of the spacer 17 surrounding the bottom electrode 16. A top electrode 19 made of placed on the capacitor insulating film 18. The bottom electrode 16, the capacitor insulating film 18 and the top electrode 19 constitute a capacitor device 20.

A nonvolatile memory is constructed of the field effect transistor 13 working as an access transistor and the capacitor device 20 working as a data storage capacitor device.

Embodiment 1

A ferroelectric capacitor device of Embodiment 1 will be described. The feature of Embodiment 1 is a ferroelectric film used as the capacitor insulating film 18. Hereinafter, therefore, only the structure of the ferroelectric film will be described.

Figure 2:
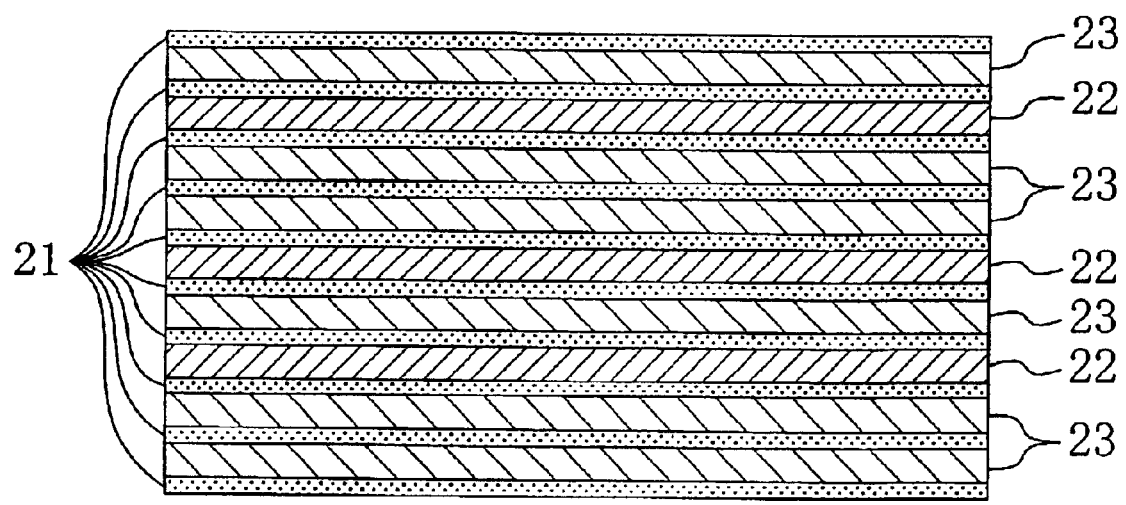
FIG. 2 is a cross-sectional view of a laminated structure of a ferroelectric film of the ferroelectric capacitor device of the embodiments of the present invention.

The ferroelectric film used as the capacitor insulating film 18 of the ferroelectric capacitor device of Embodiment 1 has a laminated structure shown in FIG. 2, which has a bismuth layer structure including a plurality of bismuth oxide layers 21 and a plurality of perovskite-like layers composed of at least one first layer 22 and at least one second layer 23, alternately put on top of each other.

Figure 3:
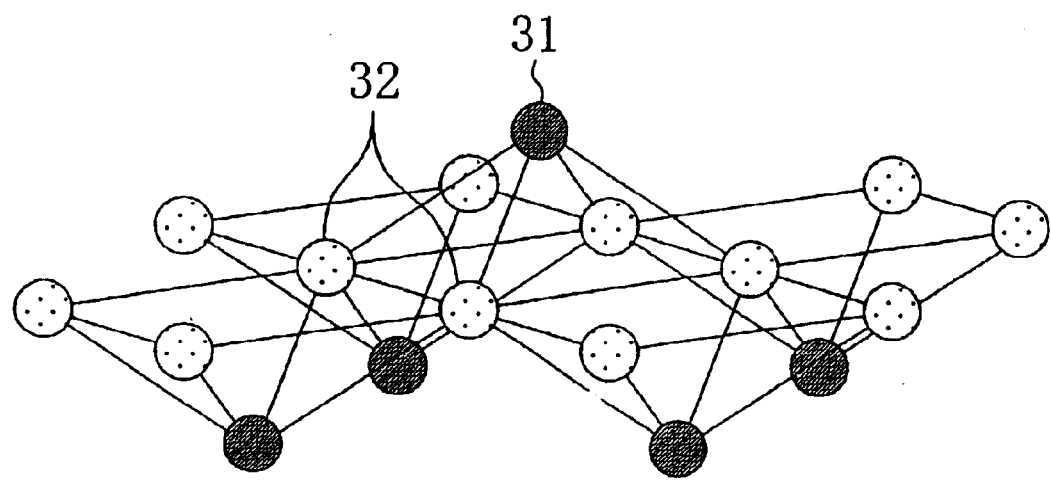
FIG. 3 is a diagrammatic view of the crystal structure of a bismuth oxide layer constituting the ferroelectric film of the ferroelectric capacitor device of any of Embodiments 1 to 4.
Figure 16:
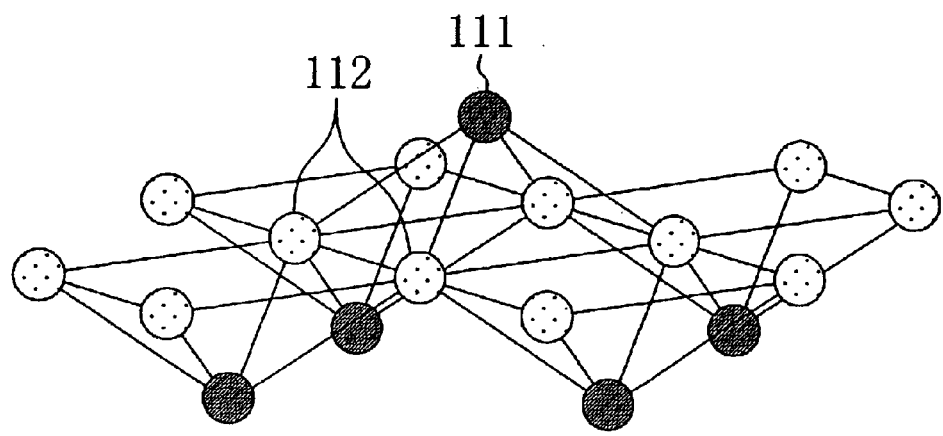
FIG. 16 is a diagrammatic view of the crystal structure of a bismuth oxide layer constituting the ferroelectric film of the ferroelectric capacitor device of the first and second prior arts.
Figure 17:
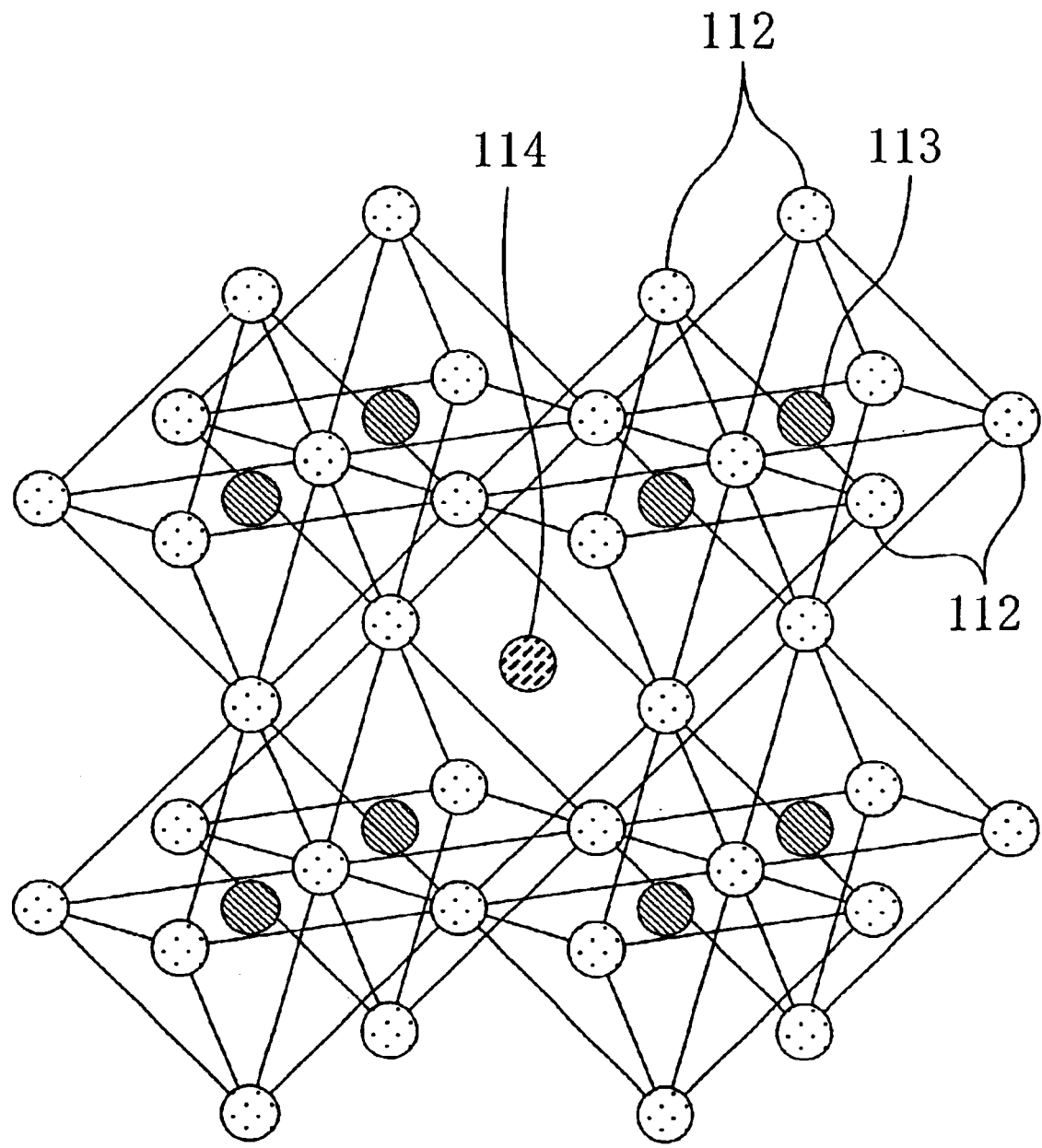
FIG. 17 is a diagrammatic view of the crystal structure of a m=2 perovskite-like layer constituting the ferroelectric film of the ferroelectric capacitor device of the first prior art.
Figure 18:
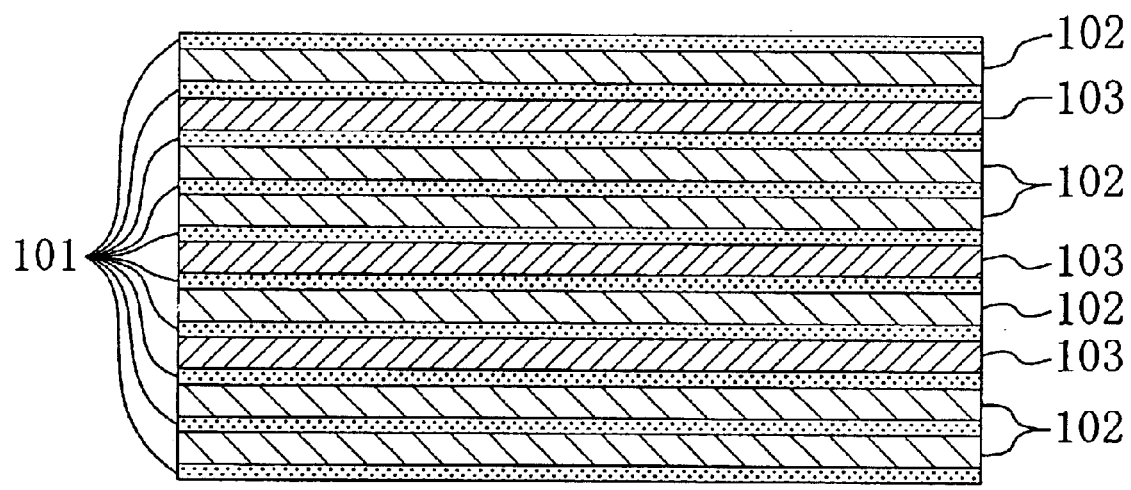
FIG. 18 is a cross-sectional view of a laminated structure of the ferroelectric film of the ferroelectric capacitor device of the first prior art.

The plurality of bismuth oxide layers 21, formed of $Bi_2O_2$, has a structure as shown in FIG. 3, in which square pyramids linked to one another extend two-dimensionally. Bismuth 31 exists at the apex of each square pyramid, and oxygen 32 exists at each corner of the bottom square of the square pyramid. This structure is the same as that shown in FIG. 16.

The plurality of perovskite-like layers are composed of at least one first layer 22 represented by $BO_{7/2}$ (B is a pentavalent metal) and at least one second layer 23 represented by $(A_{1-x}Bi_{2x/3})B_2O_7$ (A is a divalent metal, B is a pentavalent metal, and $0<x<1$).

That is, either one of the m=1 perovskite-like layer as the first layer 22 and the m=2 perovskite-like layer as the second layer 23 is interposed between every two adjacent bismuth oxide layers 21. When the existence probability of the m=1 perovskite-like layer as the first layer 22 is δ ($0<δ<1$), the existence probability of the m=2 perovskite-like layer as the second layer 23 is 1−δ.

Figure 4:
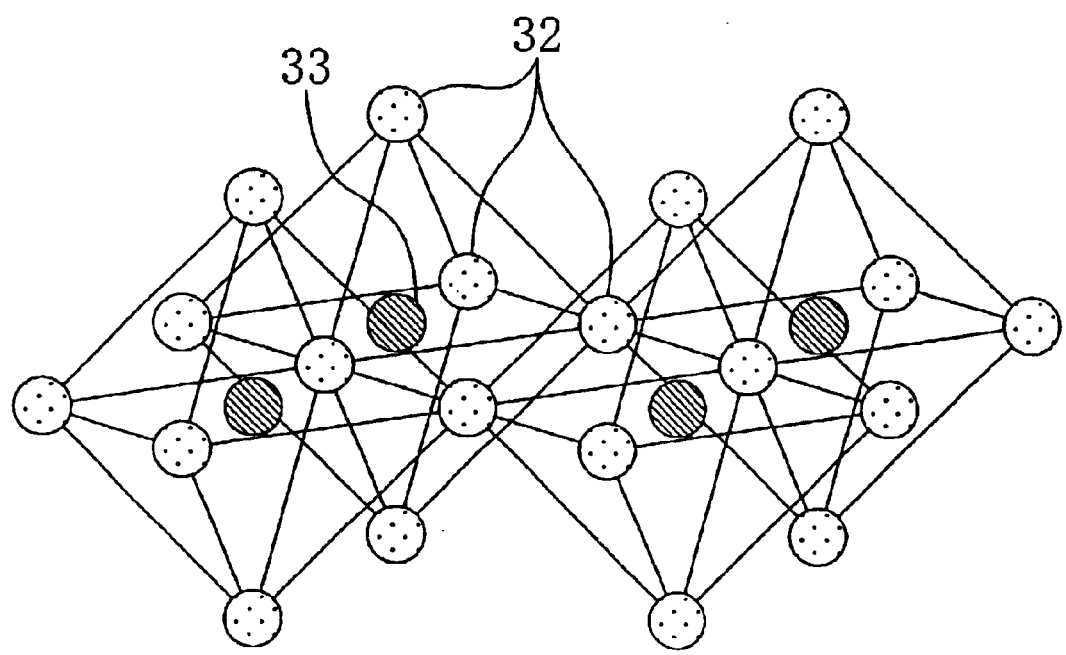
FIG. 4 is a diagrammatic view of the crystal structure of a first layer of a perovskite-like layer constituting the ferroelectric film of the ferroelectric capacitor device of Embodiment 1 or 2.

The m=1 perovskite-like layer as the first layer 22, represented by chemical formula: $TaO_4$, for example, has a layer structure as shown in FIG. 4, in which a single layer of oxygen octahedra having tantalum 33 in the center extends two-dimensionally. The tantalum 33 exists in the B site as the center of each oxygen octahedron, and oxygen 32 exists at each apex of the oxygen octahedron. If valence calculation is made strictly, the chemical formula should be $TaO_{7/2}$, indicating that the oxygen amount is short to form the structure shown in FIG. 4. A vacancy is therefore formed in an oxygen-lacking portion.

Figure 5:
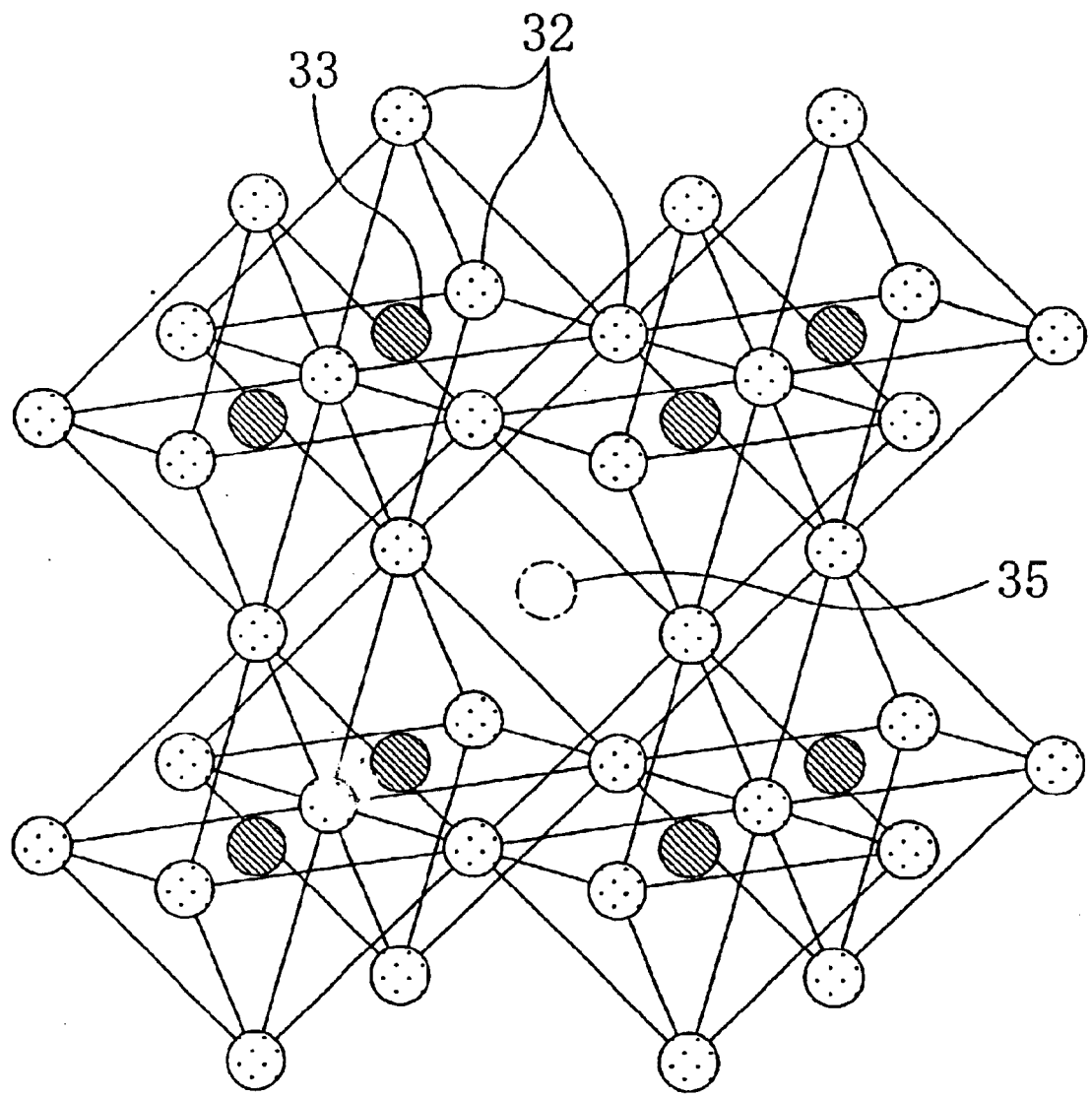
FIG. 5 is a diagrammatic view of the crystal structure of a second layer of the perovskite-like layer constituting the ferroelectric film of the ferroelectric capacitor device of Embodiment 1 or 2.

The m=2 perovskite-like layer as the second layer 23, represented by chemical formula: $(Sr_{1-x}Bi_{2x/3})Ta_2O_7$, for example, has a layer structure as shown in FIG. 5, in which oxygen octahedra extend two-dimensionally with each two placed one upon the other vertically. Tantalum 33 exists in the B site as the center of each oxygen octahedron, and oxygen 32 exists at each apex of the oxygen octahedron. The A site 35 as a space surrounded by the oxygen octahedra is occupied by Sr with a probability of (1−x), Bi with a probability of (2x/3), or a vacancy with a probability of (x/3).

As described above, a point distinguishing Embodiment 1 from the first prior art is the A site of the m=2 perovskite-like layer as the second layer 23.

The A site of the m=2 perovskite-like layer as the second layer 23 may be occupied by Ca or Ba in place of Sr. Alternatively, Sr, Ca and Ba may exist at an arbitrary ratio. In the B site, Nb or V may exist in place of Ta. Alternatively, Ta, Nb and V may exist at an arbitrary ratio. Normally, $Ta_{1-y}Nb_y$ ($0 \leq y \leq 1$) is often used for the B site.

The first feature of Embodiment 1 is that the proportion of Bi having a low melting point is large compared with the normal type. With the increased proportion of Bi, the grain size of the resultant ferroelectric film is greater, and thus the spontaneous polarization amount can be increased.

The second feature of Embodiment 1 is that a precipitation is less generated due to increased tolerance to composition shift.

Figure 10C:
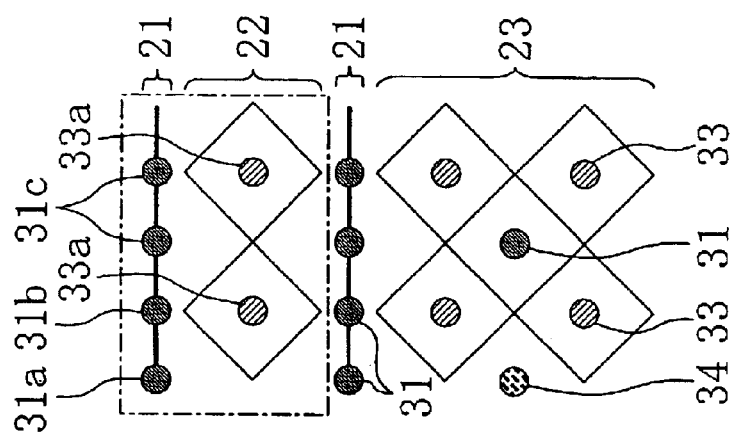
FIGS. 10A to 10C are diagrammatic views demonstrating the reason why the ferroelectric capacitor device of Embodiment 1 improves in the tolerance to composition shift.
Figure 10A:
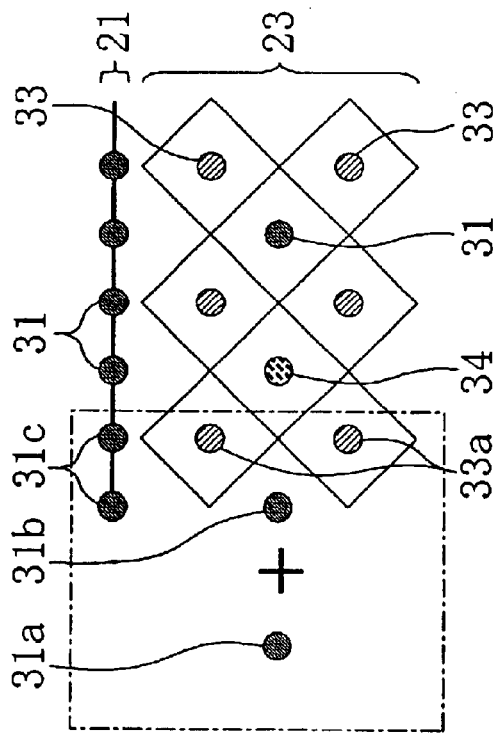
Figure 10B:
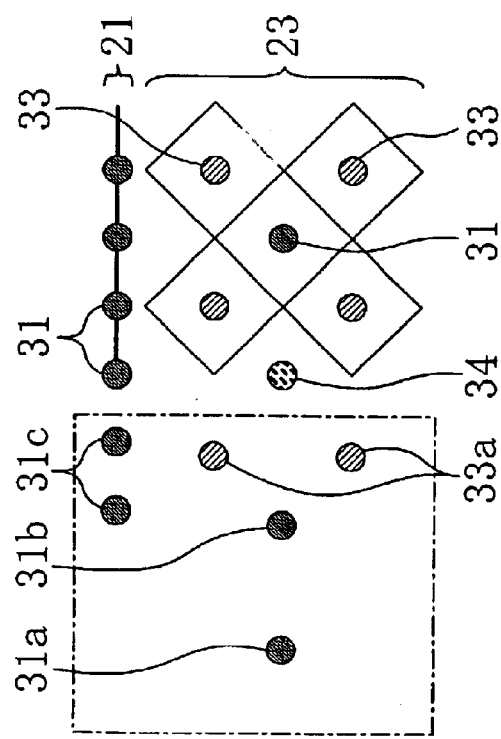

Hereinafter, the reason why the tolerance to composition shift improves will be described with reference to FIGS. 10A to 10C. FIGS. 10A to 10C are diagrammatic cross-sectional views of the crystal structure of the bismuth layer structure of the ferroelectric film in Embodiment 1, as is viewed in parallel with the layers. In FIGS. 10A to 10C, the oxygen octahedra are represented by squares and the bismuth oxide layer is represented by a bar. The numbers of atoms of tantalum 33 and strontium 34 illustrated are made to match with the mole fraction. Oxygen is omitted in these figures for simplification.

The case that the amount of bismuth is excessive by one atom will be described.

Consider one bismuth atom 31a exists excessively as shown in FIG. 10A. In this case, one bismuth atom 31b in the A site and two tantalum atoms 33a in the B sites are released in the m=2 perovskite-like layer as the second layer 23, and also two bismuth atoms 31c are released in the bismuth oxide layer 21, as shown in FIG. 10B.

As shown in FIG. 10C, the released two tantalum atoms 33a form the m=1 perovskite-like layer as the first layer 22, and the four bismuth atoms 31a, 31b and 31c newly form the bismuth oxide layer 21. In this way, the excessive bismuth atom 31a is absorbed in the layer structure.

In the case that the amount of bismuth is short, the state shown in FIG. 10C is changed to the state shown in FIG. 10A (excluding one excessive bismuth atom 31a) via the state shown in FIG. 10B, and one bismuth atom 31b in the A site can be released. In this way, the shortage of bismuth is compensated.

As described above, even if a bismuth recessive or bismuth-short state occurs causing a shift in bismuth composition, bismuth is absorbed or released, and this can suppress precipitation of bismuth.

In the case that the amount of strontium 34 is excessive, strontium 34 substitutes for the bismuth atom 31b in the A site, and by the change of the state in FIG. 10A to the state in FIG. 10C via the state in FIG. 10B, the excessive strontium 34 is absorbed in the layer structure. That is, the excessive strontium 34 and the substitute strontium 34 form the first layer 22. In the case that the amount of strontium 34 is short, the state in FIG. 10C is changed to the state in FIG. 10A via the state in FIG. 10B, and strontium 34 substitutes for the released bismuth atom 31b. In this way, the shortage of strontium 34 is compensated.

The function demonstrated with reference to FIGS. 10A to 10C is obtained because the crystal structure of the ferroelectric film in Embodiment 1 has the features of both the A-site Bi substitution type layer structure and the mixed layered superlattice type layer structure. If the amount of bismuth is short in the A-site Bi substitution type layer structure, a precipitation of $BiTaO_4$ tends to be generated. If the amount of bismuth is excessive in the mixed layered superlattice type layer structure, a precipitation of bismuth tends to be generated.

In Embodiment 1, however, the layer structure changes when the amount of bismuth, strontium or tantalum constituting the ferroelectric film is excessive or short, to compensate the excess or shortage. Therefore, no precipitation is generated, and this prevents increase in leakage current and decrease in breakdown voltage.

To confirm the effect of Embodiment 1, a prototype of the ferroelectric capacitor device was actually fabricated and evaluated. An metalorganic decomposition method was used for formation of the ferroelectric film. The composition was varied by changing the amounts of component metals put in a solution. Heat treatment was performed by rapid heating for one minute at 800° C. By adopting such a short heat treatment time, a composition shift due to evaporation of bismuth is prevented.

Figure 11:
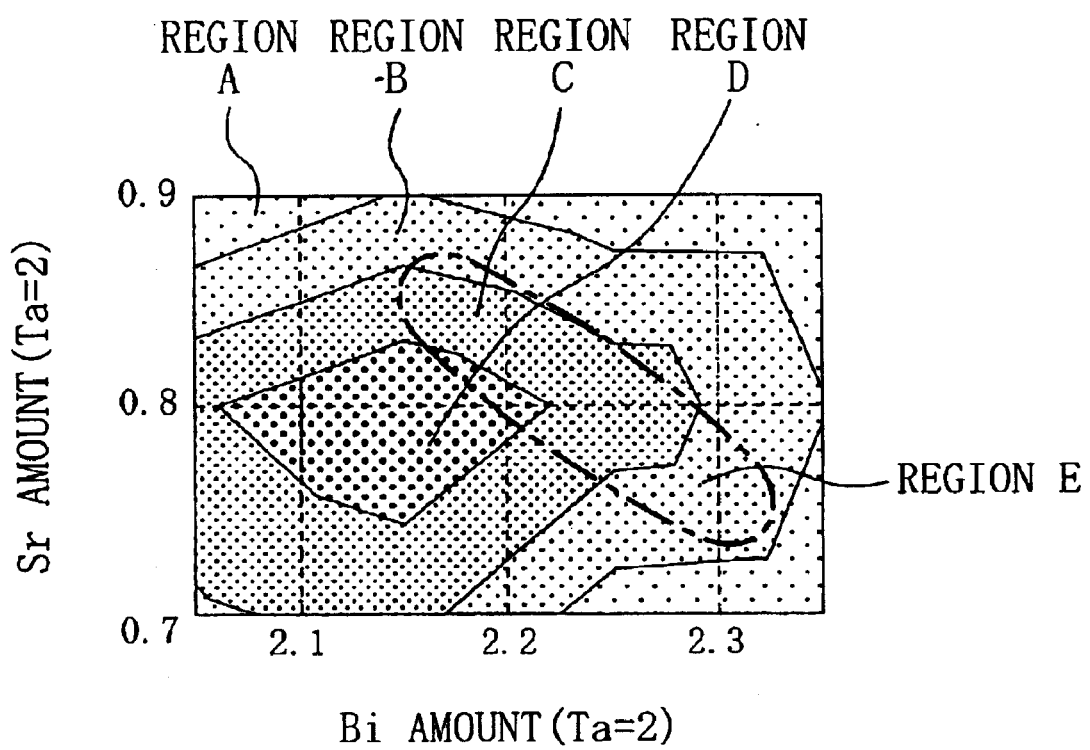
FIG. 11 is a view showing the relationship between the amounts of bismuth and strontium and the remnant polarization amount in the ferroelectric capacitor device of Embodiment 1.

FIG. 11 shows the relationship between the amounts of bismuth and strontium and the remnant polarization amount 2Pr ($\mu C/cm^2$). Note that in FIG. 11, the amounts of bismuth and strontium were varied with respect to the amount of tantalum fixed at 2. In FIG. 11, region A represents a region in which 2Pr is 6 to 8 ($\mu C/cm^2$), region B represents a region in which 2Pr is 8 to 10 ($\mu C/cm^2$), region C represents a region in which 2Pr is 10 to 12 ($\mu C/cm^2$), and region D represents a region in which 2Pr is 12 to 14 ($\mu C/cm^2$).

From FIG. 11, it is found that as the ratio of the bismuth amount to the strontium amount increases, 2Pr increases. One reason for this is that bismuth is lower in melting point and greater in grain size than strontium. However, it is also found that as the ratio of the bismuth amount to the strontium amount further increases, 2Pr decreases. This is because the ferroelectric film has been c-axis oriented.

FIG. 12 shows the relationship between the amounts of bismuth and strontium and the region free from generation of a precipitation. Note that in FIG. 12, the amounts of bismuth and strontium are varied with respect to the amount of tantalum fixed at 2.

In FIG. 12, region X located above a straight line a corresponds to the region of the first prior art, that is, the region in which $Bi_2O_3$ is precipitated, and region Y located below a straight line b corresponds to the region of the second prior art, that is, the region in which $BiTaO_4$ is precipitated. Therefore, regions X and Y are regions in which a precipitation is generated and thus increase in leakage current and decrease in breakdown voltage occur.

The region located between the straight lines a and b is the region used in Embodiment 1, in which no precipitation is generated and thus the leakage current is suppressed.

In Embodiment 1, 0<x<0.3 and 0<δ<0.3 should preferably be satisfied. The reason will be described with reference to FIGS. 11 and 12.

An overlap portion of the region in which 2Pr is as large as possible in FIG. 11 and the region in which no leakage current occurs in FIG. 12, that is, the region considered desirable from the results of FIG. 11 and the region considered desirable from the results of FIG. 12, is considered most desirable. Therefore, region E encircled with the one-dot chain line, including this overlap portion and a margin considered, is regarded a most desirable region.

In FIG. 12, the intersection point of the straight lines a and b is the point at which δ=0 in the chemical formula representing the first prior art, $(Bi_2O_2)[\delta(TaO_4)\cdot(1-\delta)(SrTa_2O_7)]$ and x=0 in the chemical formula representing the second prior art, $(Bi_2O_2)$ $[(Sr_{1-x}Bi_{2x/3})Ta_2O_7]$. That is, the intersection point is the point at which Sr=1 and Bi=2.

Also, in FIG. 12, the intersection point of the straight lines a and d is the point at which $\delta \approx 0.3$ in the chemical formula representing the first prior art, $(Bi_2O_2)[\delta(TaO_4)\cdot(1-\delta)(SrTa_2O_7)]$, that is, the point at which Sr=0.82 and Bi=2.35.

Also, in FIG. 12, the intersection point of the straight lines b and c is the point at which x=0.3 in the chemical formula representing the second prior art, $(Bi_2O_2)[(Sr_{1-x}Bi_{2x/3})Ta_2O_7]$, that is, the point at which Sr=0.7 and Bi=2.2.

From the results described above, region Z satisfying 0<x<0.3 and 0<δ<0.3 defines the most desirable region E.

Embodiment 2

A ferroelectric capacitor device of Embodiment 2 will be described. As in Embodiment 1, the feature of Embodiment 2 is a ferroelectric film used as the capacitor insulating film 18 of the capacitor device 20. Hereinafter, therefore, only the structure of the ferroelectric film will be described.

The ferroelectric film used as the capacitor insulating film 18 of the ferroelectric capacitor device of Embodiment 2 has a laminated structure shown in FIG. 2, which has a bismuth layer structure including a plurality of bismuth oxide layers 21 and a plurality of perovskite-like layers composed of at least one first layer 22 and at least one second layer 23, alternately put on top of each other.

The plurality of bismuth oxide layers 21, formed of $Bi_2O_2$, has a structure as shown in FIG. 3, in which square pyramids linked to one another extend two-dimensionally. Bismuth 31 exists at the apex of each square pyramid, and oxygen 32 exists at each corner of the bottom square of the square pyramid. This structure is the same as that shown in FIG. 16.

The plurality of perovskite-like layers are composed of at least one first layer 22 represented by $B^1O_{7/2}$ ($B^1$ is a pentavalent metal) and at least one second layer 23 represented by $(A_{1-x}Bi_x)(B^1_{2-x}B^2_xO_7)$ (A is a divalent metal, $B^1$ is a pentavalent metal, $B^2$ is a tetravalent, and 0<x<1).

That is, either one of the m=1 perovskite-like layer as the first layer 22 and the m=2 perovskite-like layer as the second layer 23 is interposed between every two adjacent bismuth oxide layers 21. When the existence probability of the m=1 perovskite-like layer as the first layer 22 is δ (0<δ<1), the existence probability of the m=2 perovskite-like layer as the second layer 23 is 1−δ.

Figure 19:
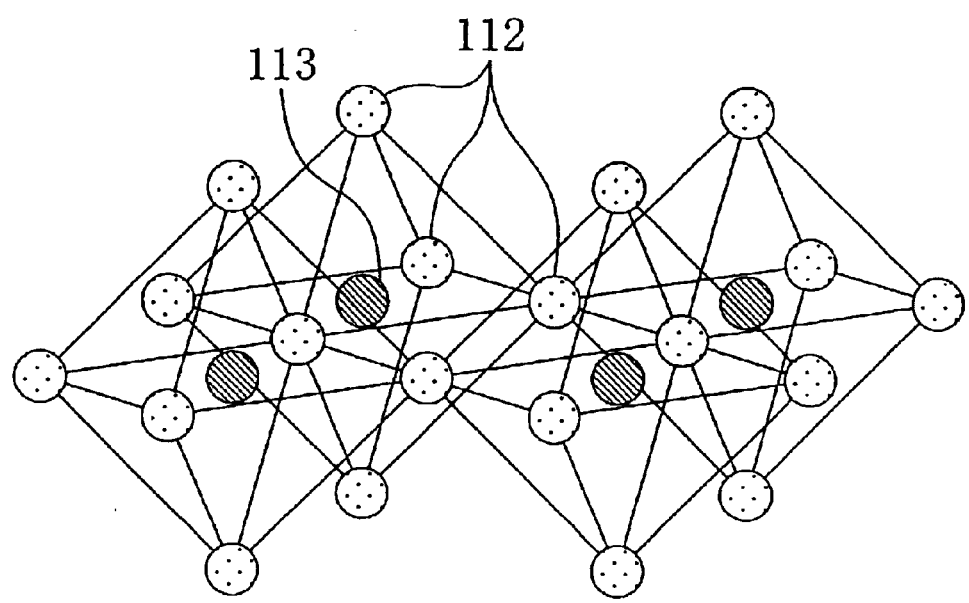
FIG. 19 is a diagrammatic view of the crystal structure of a m=1 perovskite-like layer constituting the ferroelectric film of the ferroelectric capacitor device of the first prior art.
Figure 20:
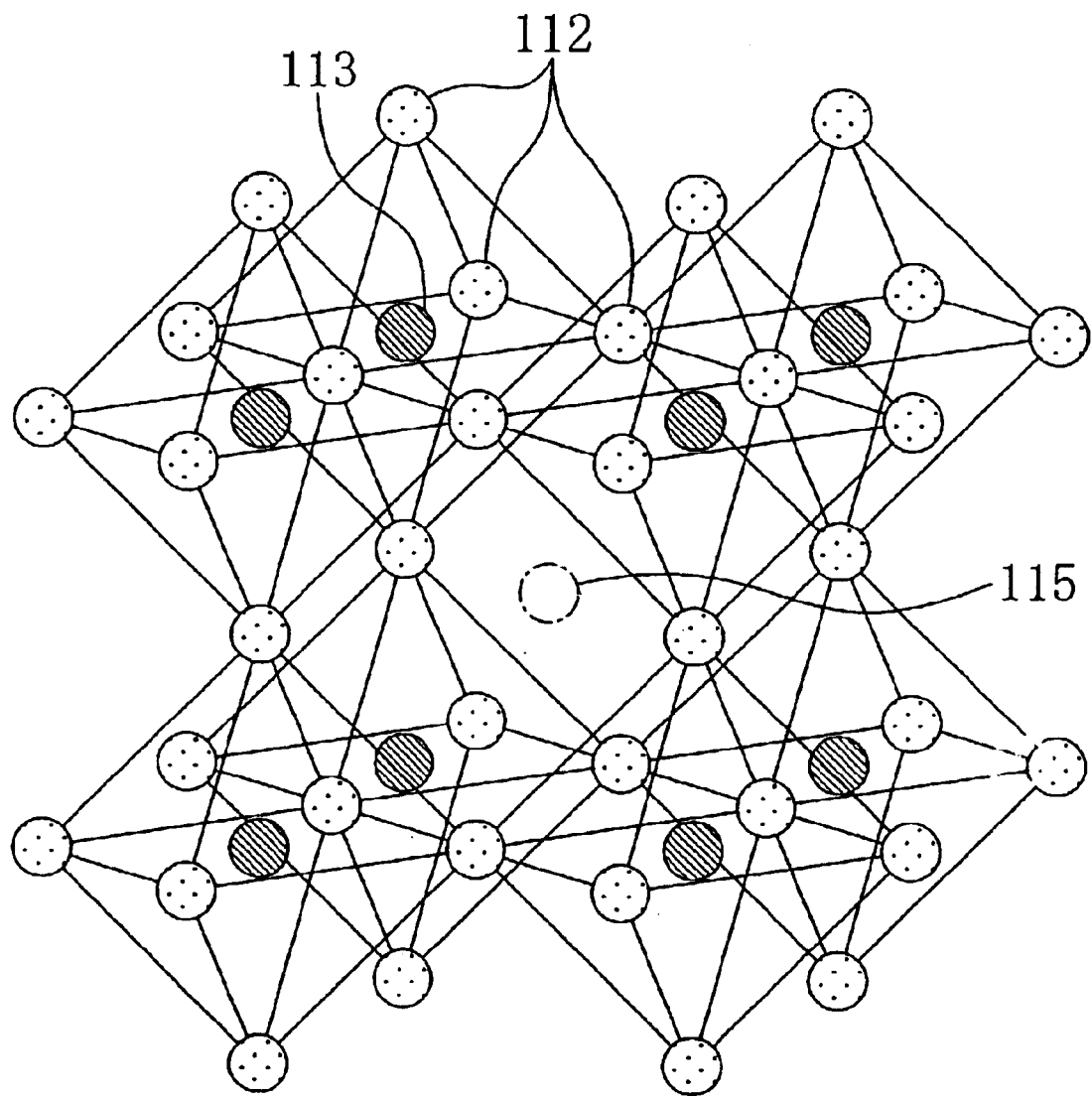
FIG. 20 is a diagrammatic view of the crystal structure of a m=2 perovskite-like layer constituting the ferroelectric film of the ferroelectric capacitor device of the second prior art.

The m=1 perovskite-like layer as the first layer 22, represented by chemical formula: $TaO_4$, for example, has a layer structure as shown in FIG. 4, in which a single layer of oxygen octahedra having tantalum 33 in the center extends two-dimensionally. The tantalum 33 exists in the B site as the center of each oxygen octahedron, and oxygen 32 exists at each apex of the oxygen octahedron. If valence calculation is made strictly, the chemical formula should be $TaO_{7/2}$, indicating that the oxygen amount is short to form the structure shown in FIG. 4. A vacancy is therefore formed in an oxygen-lacking portion. The structure of the first layer 22 is the same as that shown in FIG. 19.

The m=2 perovskite-like layer as the second layer 23, represented by chemical formula: $(Sr_{1-x}Bi_x)(Ta_{2-x}Ti_x)O_7$, for example, has a layer structure as shown in FIG. 5, in which oxygen octahedra extend two-dimensionally with each two placed one upon the other vertically. The B site as the center of each oxygen octahedron is occupied by Ta with a probability of ((2−x)/2) or Ti with a probability of (x/2). Oxygen 32 exists at each apex of the oxygen octahedron. The A site 35 as a space surrounded by the oxygen octahedra is occupied by Sr with a probability of (1−x) and Bi with a probability of (x). Important in this embodiment is that Bi in the A sites and Ti in the B sites exist in the same amount.

In the m=2 perovskite-like layer as the second layer 23, the A site 35 may be occupied by Ca or Ba in place of Sr. Alternatively, Sr, Ca and Ba may exist at an arbitrary ratio. In the B site, Nb or V may exist in place of Ta. Alternatively, Ta, Nb and V may exist at an arbitrary ratio. Normally, $Ta_{1-y}Nb_y$ (0≦y≦1) is often used for the B site. In addition, Zr or Hf may be used in place of Ti.

As in Embodiment 1, the first feature of Embodiment 2 is that the proportion of Bi having a low melting point is large compared with the normal type. With the increased proportion of Bi, the grain size increases in the resultant ferroelectric film, and thus the spontaneous polarization amount can be increased.

The second feature of Embodiment 2 is that a precipitation is less generated due to increased tolerance to composition shift, according to the principle described in Embodiment 1.

Unlike Embodiment 1, Embodiment 2 has the third feature that no vacancy is formed in the A site in the m=2 perovskite-like layer as the second layer 23. The reason why no vacancy is formed is that tetravalent Ti substitutes for pentavalent Ta in the B sites by the same amount as that by which trivalent Bi substitutes for divalent Sr in the A sites, and thus the charge neutrality law is satisfied. A vacancy existing in the A site may act as a factor of degrading the reliability of the film including problems related to endurance and imprint. Therefore, by suppressing formation of vacancies, the reliability can be improved.

Thus, in Embodiment 2, the spontaneous polarization amount can be increased without causing increase in leakage current, decrease in breakdown voltage and degradation in reliability.

Embodiment 3

A ferroelectric capacitor device of Embodiment 3 will be described. The feature of Embodiment 3 is a ferroelectric film used as the capacitor insulating film 18. Hereinafter, therefore, only the structure of the ferroelectric film will be described.

The ferroelectric film used as the capacitor insulating film 18 of the ferroelectric capacitor device of Embodiment 3 has a laminated structure shown in FIG. 2, which has a bismuth layer structure including a plurality of bismuth oxide layers 21 and a plurality of perovskite-like layers composed of at least one first layer 22 and at least one second layer 23, alternately put on top of each other.

The plurality of bismuth oxide layers 21, formed of $Bi_2O_2$, has a structure as shown in FIG. 3 in which square pyramids linked to one another extend two-dimensionally. Bismuth 31 exists at the apex of each square pyramid, and oxygen 32 exists at each corner of the bottom square of the square pyramid. This structure is the same as that shown in FIG. 16.

The plurality of perovskite-like layers are composed of at least one first layer 22 represented by $BO_3$ (B is a tetravalent metal) and at least one second layered represented by $(A_{1-x}Bi_x)_2B_3O_{10}$ (A is a trivalent metal, B is a tetravalent metal, and 0<x<1).

That is, either one of the m=1 perovskite-like layer as the first layer 22 and the m=3 perovskite-like layer as the second layer 23 is interposed between every two adjacent bismuth oxide layers 21. When the existence probability of the m=1 perovskite-like layer as the first layer 22 is δ (0<δ<1), the existence probability of the m=3 perovskite-like layer as the second layer 22 is 1−δ.

Figure 6:
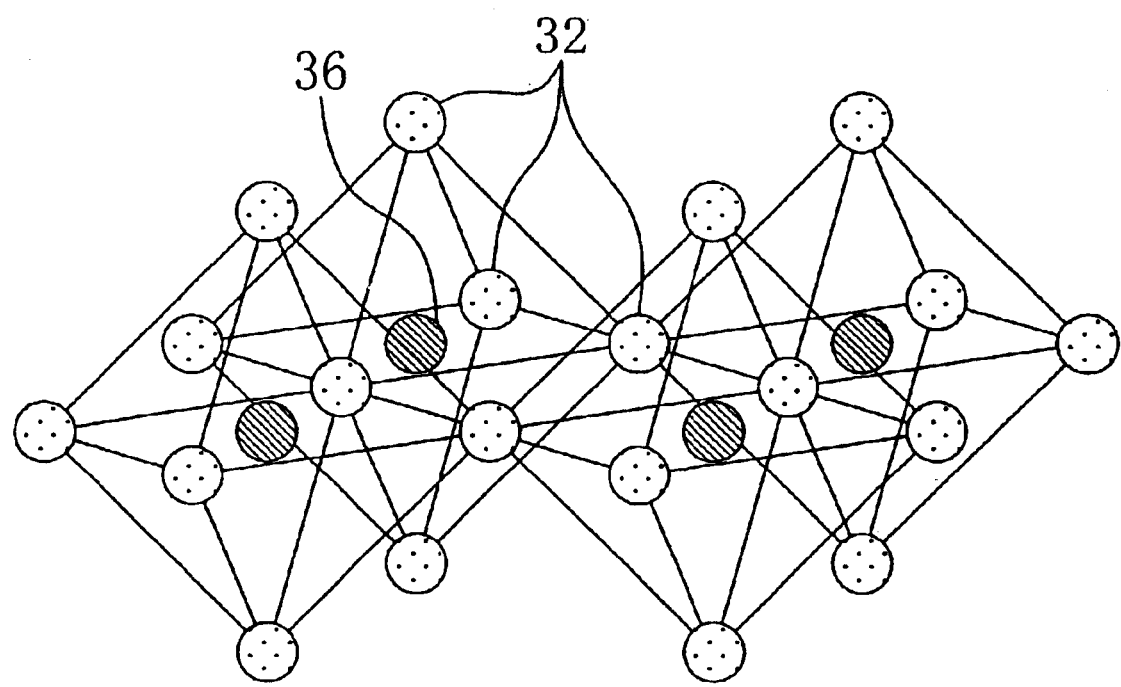
FIG. 6 is a diagrammatic view of the crystal structure of a first layer of a perovskite-like layer constituting the ferroelectric film of the ferroelectric capacitor device of Embodiment 3.

The m=1 perovskite-like layer as the first layer 22, represented by chemical formula: $TiO_4$, for example, has a layer structure as shown in FIG. 6, in which a single layer of oxygen octahedra having titanium 36 in the center extends two-dimensionally. The titanium 36 exists in the B site as the center of each oxygen octahedron, and oxygen 32 exists at each apex of the oxygen octahedron. If valence calculation is made strictly, the chemical formula should be $TiO_3$, indicating that the oxygen amount is short to form the structure shown in FIG. 6. A vacancy is therefore formed in an oxygen-lacking portion.

Figure 7:
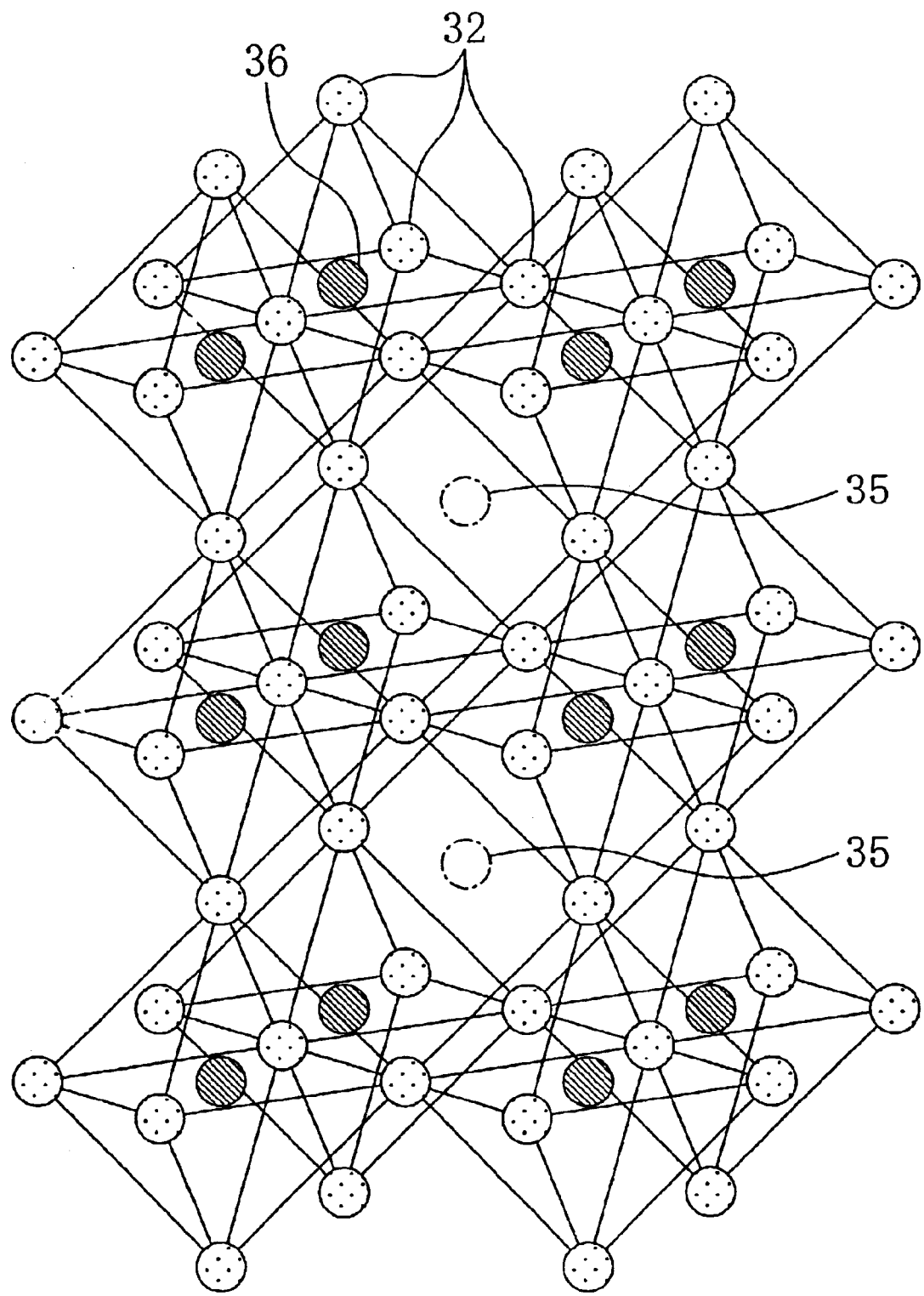
FIG. 7 is a diagrammatic view of the crystal structure of a second layer of the perovskite-like layer constituting the ferroelectric film of the ferroelectric capacitor device of Embodiment 3.

The m=3 perovskite-like layer as the second layer 23, represented by chemical formula: $(La_{1-x}Bi_x)_2Ti_3O_{10}$, for example, has a layer structure as shown in FIG. 7, in which oxygen octahedra extend two-dimensionally with each three placed one upon another vertically. Titanium 36 exists in the B site as the center of each oxygen octahedron, and oxygen 32 exists at each apex of the oxygen octahedron. The A site 35 as a space surrounded by the oxygen octahedra is occupied by La with a probability of (1−x) and Bi with a probability of (x).

The value x indicating the proportion of Bi with respect to La is preferably 0.5<x<0.75 because the value of 2Pr is large when x is within this range. The value of 2Pr is maximum when x is about 0.625, which is therefore particularly preferred.

In the m=3 perovskite-like layer as the second layer 23, the A site 35 may be occupied by a lanthanoide such as Ce, Pr, Nd, Pm, Sm, Eu, Gd, Tb, Dy, Ho, Er, Tm, Yb or Lu, in place of La. Alternatively, these lanthanoides may exist at an arbitrary ratio. The B site may be occupied by Zr or Hf in place of Ti. Alternatively, Ti, Zr and Hf may exist at an arbitrary ratio.

Figure 13C:
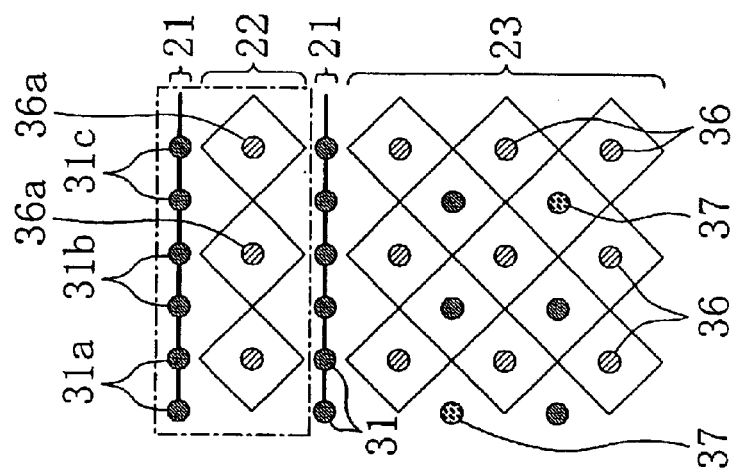
FIGS. 13A to 13C are diagrammatic views demonstrating the reason why the ferroelectric capacitor device of Embodiment 3 improves in the tolerance to composition shift.
Figure 13A:
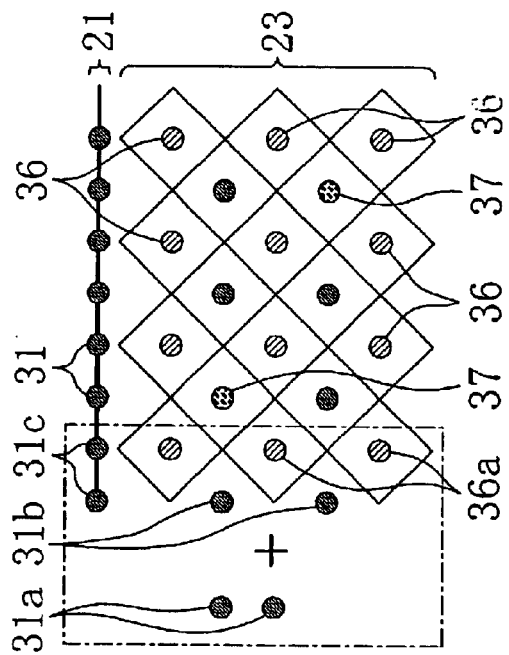
Figure 13B:
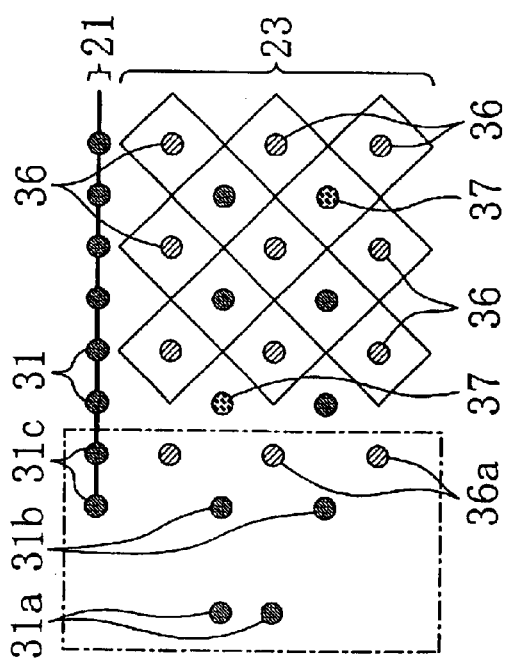

Hereinafter, the reason why the tolerance to composition shift improves in Embodiment 3 will be described with reference to FIGS. 13A to 13C. FIGS. 13A to 13C are diagrammatic cross-sectional views of the crystal structure of the bismuth layer structure of the ferroelectric film of Embodiment 3, as is viewed in parallel with the layers. In FIGS. 13A to 13C, the oxygen octahedra are represented by squares and the bismuth oxide layer is represented by a bar. The numbers of atoms of bismuth 31, titanium 36 and lanthanum 37 illustrated are made to match with the mole fraction. Oxygen is omitted in these figures for simplification.

The case that the amount of bismuth is excessive by two atoms will be described.

Consider two bismuth atoms 31a exist excessively as shown in FIG. 13A. In this case, two bismuth atoms 31b in the A sites and three titanium atoms 36a in the B sites are released in the m=3 perovskite-like layer as the second layer 23, and also two bismuth atoms 31c are released in the bismuth oxide layer 21, as shown in FIG. 13B.

As shown in FIG. 13C, the released three titanium atoms 36a form the m=1 perovskite-like layer as the first layer 22, and the six bismuth atoms 31a, 31b and 31c newly form the bismuth oxide layer 21. In this way, the two excessive bismuth atoms 31a are absorbed in the layer structure.

In the case that the amount of bismuth is short, the state shown in FIG. 13C is changed to the state shown in FIG. 13A (excluding the two excessive bismuth atoms 31a) via the state shown in FIG. 13B, and two bismuth atoms 31b in the A sites can be released. In this way, the shortage of bismuth is compensated.

As described above, even if a bismuth-excessive or bismuth-short state occurs causing a shift in bismuth composition, bismuth is absorbed or released, and thus precipitation of bismuth is suppressed.

In the case that the amount of lanthanum 37 is excessive, lanthanum 37 substitutes for the bismuth atom 31b in the A site, and by the change of the state in FIG. 13A to the state in FIG. 13C via the state in FIG. 13B, the excessive lanthanum 37 is absorbed in the layer structure. That is, the excessive lanthanum 37 and the substitute lanthanum 37 form the first layer 22. In the case that the amount of lanthanum 37 is short, the state in FIG. 13C is changed to the state in FIG. 13A via the state in FIG. 13B, and lanthanum 37 substitutes for the released bismuth atom 31b. In this way, the shortage of lanthanum 37 is compensated.

Excess of titanium 36 implies shortage of bismuth 31 or lanthanum 37, and shortage of titanium 36 implies excess of bismuth 31 or lanthanum 37. Therefore, compensation for excess or shortage of titanium 36 is made by the change of the state as described above.

Embodiment 4

A ferroelectric capacitor device of Embodiment 4 will be described. The feature of Embodiment 4 is a ferroelectric film used as the capacitor insulating film 18. Hereinafter, therefore, only the structure of the ferroelectric film will be described.

The ferroelectric film used as the capacitor insulating film 18 of the ferroelectric capacitor device of Embodiment 4 has a laminated structure shown in FIG. 2, which has a bismuth layer structure including a plurality of bismuth oxide layers 21 and a plurality of perovskite-like layers composed of at least one first layer 22 and at least one second layer 23, alternately put on top of each other.

The plurality of bismuth oxide layers 21, formed of $Bi_2O_2$, has a structure as shown in FIG. 3, in which square pyramids linked to one another extend two-dimensionally. Bismuth 31 exists at the apex of each square pyramid, and oxygen 32 exists at each corner of the bottom square of the square pyramid. This structure is the same as that shown in FIG. 16.

The plurality of perovskite-like layers are composed of at least one first layer 22 represented by $(A_{1-x}Bi_x)B_2O_7$ (A is a trivalent metal, B is a tetravalent metal, and 0<x<1) and at least one second layer 23 represented by $(A_{1-x}Bi_x)_2B_3O_{10}$ (A is a trivalent metal, B is a tetravalent metal, and 0<x<1).

That is, either one of the m=2 perovskite-like layer as the first layer 22 and the m=3 perovskite-like layer as the second layer 23 is interposed between every two adjacent bismuth oxide layers 21. When the existence probability of the m=2 perovskite-like layer as the first layer 22 is δ (0<δ<1), the existence probability of the m=3 perovskite-like layer as the second layer 23 is 1−δ.

Figure 8:
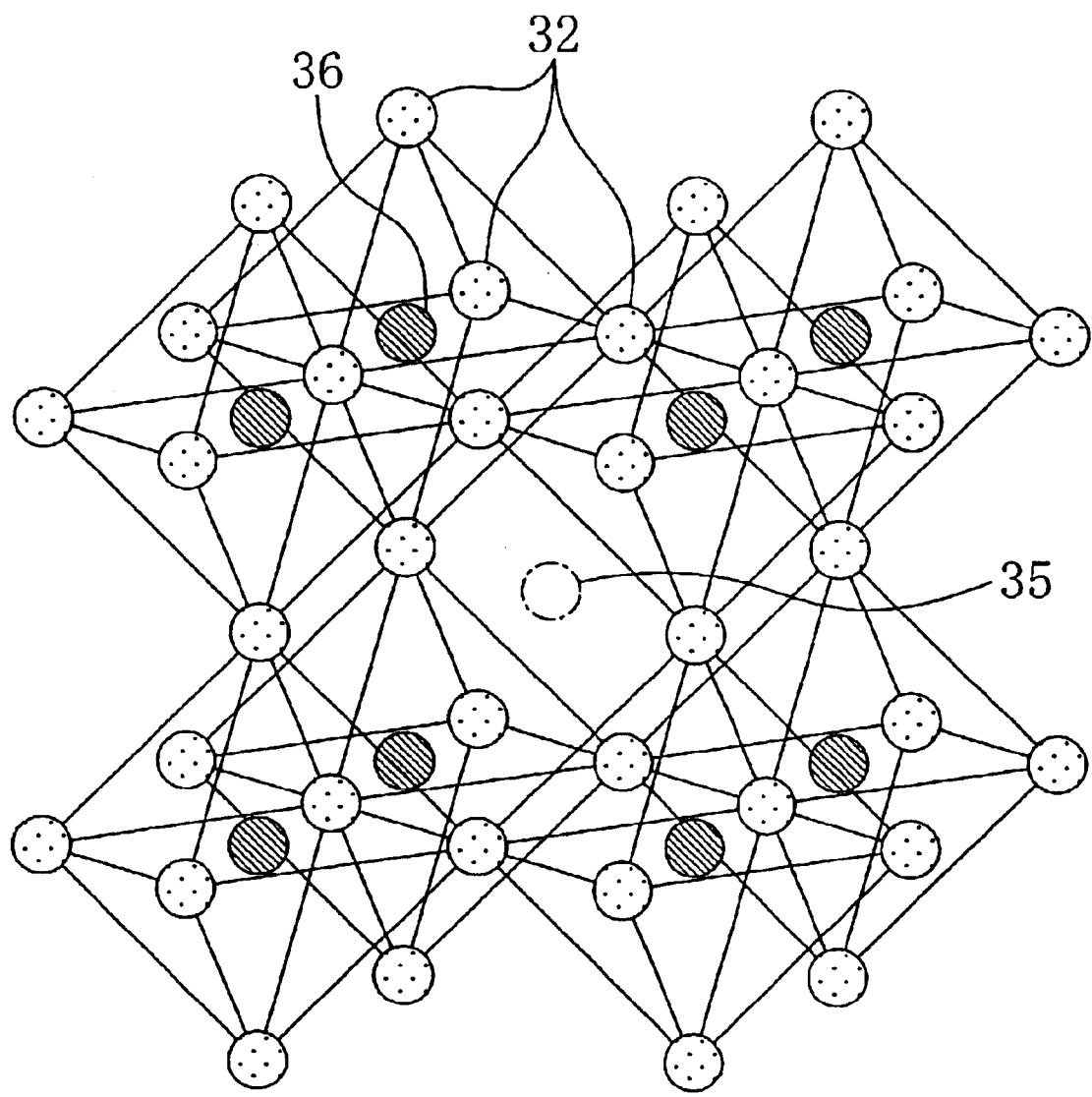
FIG. 8 is a diagrammatic view of the crystal structure of a first layer of a perovskite-like layer constituting the ferroelectric film of the ferroelectric capacitor device of Embodiment 4.

The m=2 perovskite-like layer as the first layer 22, represented by chemical formula: $(La_{1-x}Bi_x)Ti_2O_7$, for example, has a layer structure as shown in FIG. 8, in which oxygen octahedra having titanium 36 in the center extend two-dimensionally with each two placed one upon the other vertically. The titanium 36 exists in the B site as the center of each oxygen octahedron, and oxygen 32 exists at each apex of the oxygen octahedron. The A site 35 as a space surrounded by the oxygen octahedra is occupied by La with a probability of (1−x) and Bi with a probability of (x).

Figure 9:
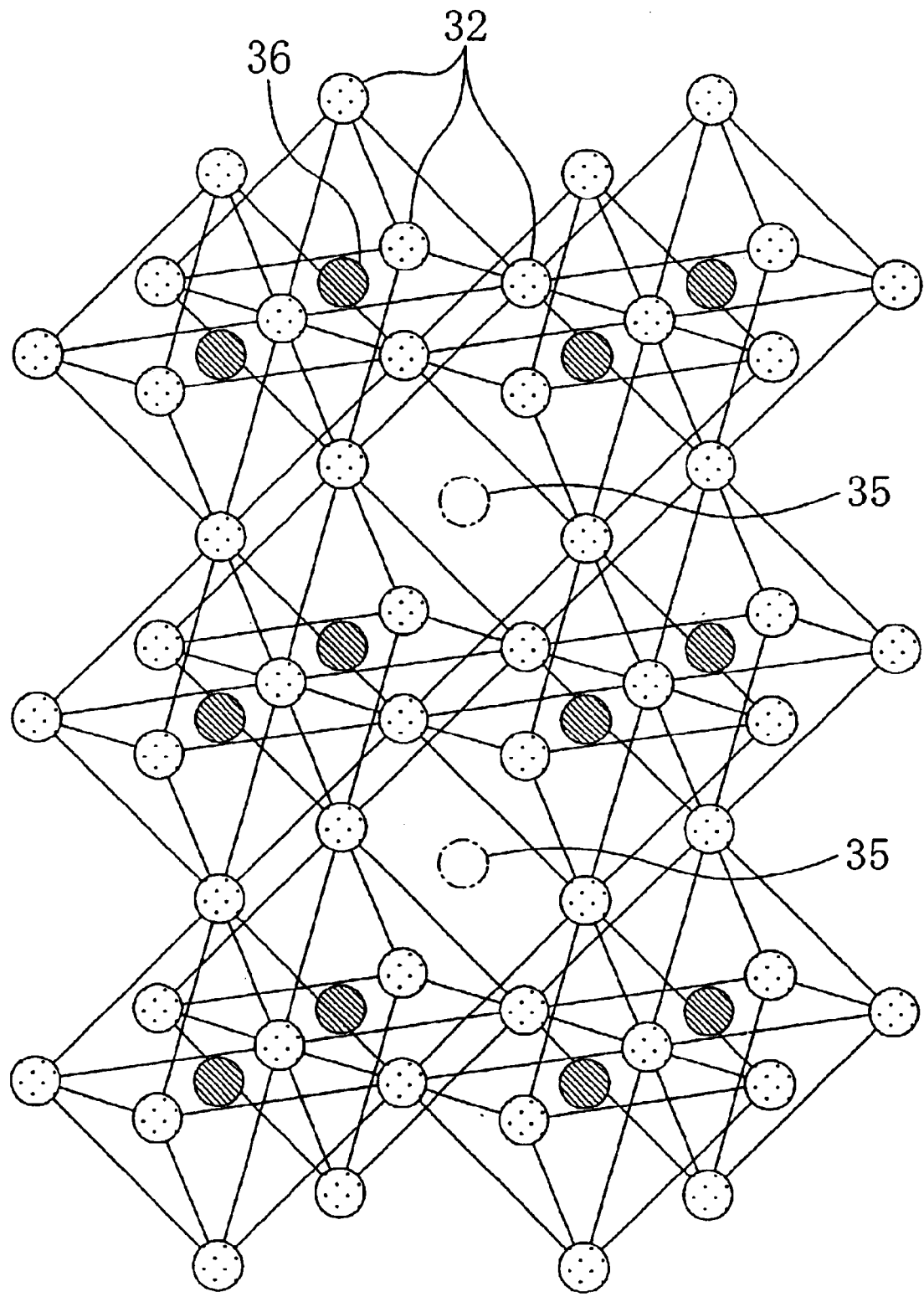
FIG. 9 is a diagrammatic view of the crystal structure of a second layer of the perovskite-like layer constituting the ferroelectric film of the ferroelectric capacitor device of Embodiment 4.

The m=3 perovskite-like layer as the second layer 23, represented by chemical formula: $(La_{1-x}Bi_x)_2Ti_3O_{10}$, for example, has a layer structure as shown in FIG. 9, in which oxygen octahedra extend two-dimensionally with each three placed one upon another vertically. Titanium 36 exists in the B site as the center of each oxygen octahedron, and oxygen 32 exists at each apex of the oxygen octahedron. The A site 35 as a space surrounded by the oxygen octahedra is occupied by La with a probability of (1−x) and Bi with a probability of (x).

The value x indicating the proportion of Bi with respect to La is preferably $0.5<x<0.75$ because the value of 2Pr is large when x is within this range. The value of 2Pr is maximum when x is about 0.625, which is therefore particularly preferred.

In the m=3 perovskite-like layer as the second layer 23, the A site 35 may be occupied by a lanthanoide such as Ce, Pr, Nd, Pm, Sm, Eu, Gd, Th, Dy, Ho, Er, Tm, Yb or Lu, in place of La. Alternatively, these lanthanoides may exist at an arbitrary ratio. In the B site, Zr or Hf may exist in place of Ti. Alternatively, Ti Zr and Hf may exist at an arbitrary ratio.

Figure 14C:
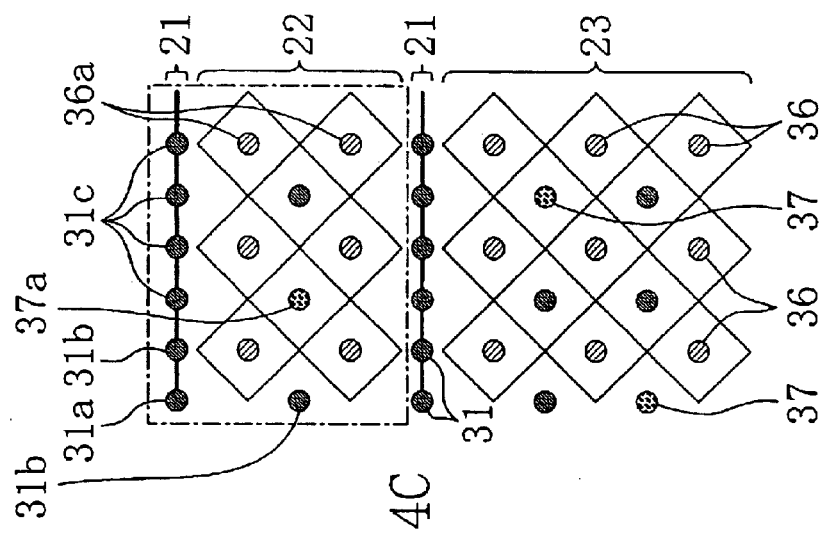
FIGS. 14A to 14C are diagrammatic views demonstrating the reason why the ferroelectric capacitor device of Embodiment 4 improves in the tolerance to composition shift.
Figure 14A:
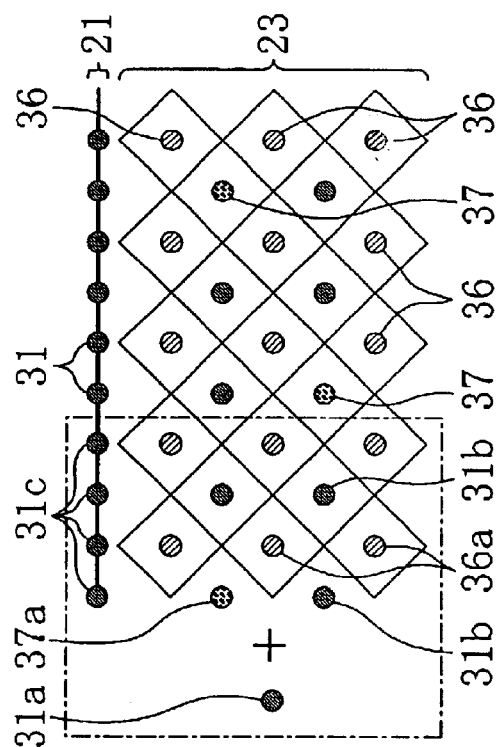
Figure 14B:
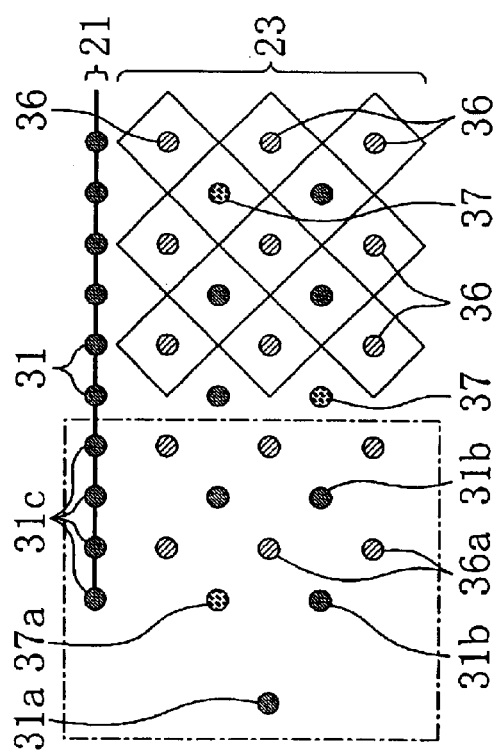
Figure 15:
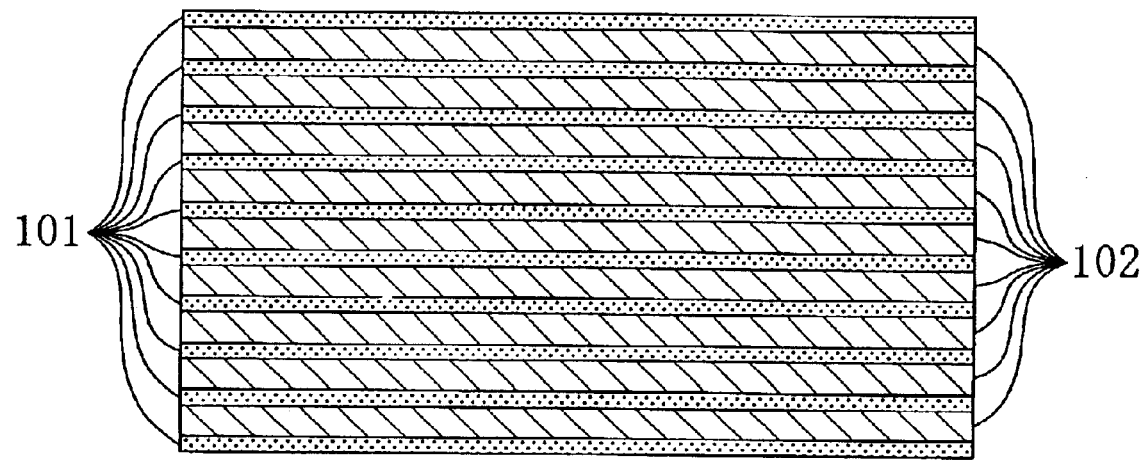
FIG. 15 is a cross-sectional view of a bismuth layer structure as a base of a ferroelectric film of a ferroelectric capacitor device of the first and second prior arts.

Hereinafter, the reason why the tolerance to composition shift improves in Embodiment 4 will be described with reference to FIGS. 14A to 14C. FIGS. 14A to 14C are diagrammatic cross-sectional views of the crystal structure of the bismuth layer structure of the ferroelectric film of Embodiment 4, as is viewed in parallel with the layers. In FIGS. 14A to 14C, the oxygen octahedra are represented by squares and the bismuth oxide layer is represented by a bar. The numbers of atoms of bismuth 31, titanium 36 and lanthanum 37 shown in FIGS. 14A to 14C are made to match with the mole fraction. Oxygen is omitted in these figures for simplification.

The case that the amount of bismuth is excessive by one atom will be described.

Consider one bismuth atom 31a exists excessively as shown in FIG. 14A. In this case, three bismuth atoms 31b and one lanthanum atom 37a in the A sites and six titanium atoms 36a in the B sites are released in the m=3 perovskite-like layer as the second layer 23, and also four bismuth atoms 31c are released in the bismuth oxide layer 21, as shown in FIG. 14B.

As shown in FIG. 14C, the released six titanium atoms 36a, two bismuth atoms 31b and one lanthanum atom 37a form the m=2 perovskite-like layer as the first layer 22, and the six bismuth atoms 31a, 31b and 31c newly form the bismuth oxide layer 21. In this way, one excessive bismuth atom 31a is absorbed in the layer structure.

In the case that the amount of bismuth is short, the state shown in FIG. 14C is changed to the state shown in FIG. 14A (excluding one excessive bismuth atom 31a) via the state shown in FIG. 14B, and two bismuth atoms 31b in the A sites are released. In this way, the shortage of the bismuth is compensated.

As described above, if a bismuth-excessive or bismuth-short state occurs causing a shift in bismuth composition, bismuth is absorbed or released and thus precipitation of bismuth is suppressed.

In the case that the amount of lanthanum 37 is excessive, lanthanum 37 substitutes for the bismuth atom 31b in the A site, and by the change of the state in FIG. 14A to the state in FIG. 14C via the state in FIG. 14B, the excessive lanthanum 37 is absorbed in the layer structure. That is, the excessive lanthanum 37 and the substitute lanthanum 37 form the first layer 22. In the case that the amount of lanthanum 37 is short, the state in FIG. 14C is changed to the state in FIG. 14A via the state in FIG. 14B, and lanthanum 37 substitutes for the released bismuth atom 31b. In this way, the shortage of lanthanum 37 is compensated.

Excess of titanium 36 implies shortage of bismuth 31 or lanthanum 37, and shortage of titanium 36 implies excess of bismuth 31 or lanthanum 37. Therefore, compensation for excess or shortage of titanium 36 is made by the change of the state as described above.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A ferroelectric capacitor device comprising a bottom electrode, a capacitor insulating film formed of a ferroelectric film, and a top electrode,
   wherein the ferroelectric film has a bismuth layer structure including a plurality of bismuth oxide layers and a plurality of perovskite-like layers alternately put on top of each other,
   the plurality of bismuth oxide layers are formed of $Bi_2O_2$, and
   the plurality of perovskite-like layers includes two or more kinds of layers represented by general formula (1): $A_{m-1}B_mO_{3m+\alpha}$ (where A is a univalent, divalent or trivalent metal, B is a tetravalent, pentavalent or hexavalent metal, m is an integer equal to or more than 1, at least one of A being Bi if m is an integer equal to or more than 2, and $0 \leq \alpha \leq 1$) and different in the value of m from each other.

2. A ferroelectric capacitor device comprising a bottom electrode, a capacitor insulating film formed of a ferroelectric film, and a top electrode,
   wherein the ferroelectric film has a bismuth layer structure including a plurality of bismuth oxide layers and a plurality of perovskite-like layers alternately put on top of each other,
   the plurality of bismuth oxide layers are formed of $Bi_2O_2$, and
   the plurality of perovskite-like layers include at least one first layer represented by general formula (2): $BO_{3+\alpha}$ (where B is a tetravalent, pentavalent or hexavalent metal and $0 \leq \alpha \leq 1$) and at least one second layer represented by general formula (3): $A_{m-1}B_mO_{3m+1}$ (where A is a univalent, divalent or trivalent metal, and m is an integer equal to or more than 2, at least one of A being Bi).

3. A ferroelectric capacitor device comprising a bottom electrode, a capacitor insulating film formed of a ferroelectric film, and a top electrode,
   wherein the ferroelectric film has a bismuth layer structure including a plurality of bismuth oxide layers and a plurality of perovskite-like layers alternately put on top of each other,
   the plurality of bismuth oxide layers are formed of $Bi_2O_2$, and
   the plurality of perovskite-like layers include at least one first layer represented by general formula (4): $BO_{7/2}$ (where B is a pentavalent metal) and at least one second layer represented by general formula (5): $(A_{1-x}Bi_{2x/3})B_2O_7$ (where A is a divalent metal, B is a pentavalent metal, and $0<x<1$).

4. The ferroelectric capacitor device of claim 3, wherein in the general formulae (4) and (5), A is Sr, B is $Ta_{1-y}Nb_y$ (where $0 \leq y \leq 1$).

5. The ferroelectric capacitor device of claim 3, wherein the probability of the first layer in the plurality of perovskite-like layers being represented by the general formula $BO_{7/2}$ is greater than 0 and smaller than 0.3, and $0<x<0.3$ in the general formula (5).

6. A ferroelectric capacitor device comprising a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (6): $B^1O_{7/2}$ (where $B^1$ is a pentavalent metal) and at least one second layer represented by general formula (7): $(A_{1-x}Bi_x)B^1{}_{2-x}B^2{}_xO_7$ (where A is a divalent metal, $B^1$ is a pentavalent metal, $B^2$ is a tetravalent metal, and 0<x<1).

7. The ferroelectric capacitor device of claim 6, wherein in the general formulae (6) and (7), A is Sr, $B^1$ is $Ta_{1-y}Nb_y$ (where $0 \leq y \leq 1$), and $B^2$ is Ti.

8. The ferroelectric capacitor device of claim 6, wherein the probability of the first layer in the plurality of perovskite-like layers being represented by the general formula $B^1O_{7/2}$ is greater than 0 and smaller than 0.3, and 0<x<0.3 in the general formula (7).

9. A ferroelectric capacitor device comprising a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (8): $BO_3$ (where B is a tetravalent metal) and at least one second layer represented by general formula (9): $(A_{1-x}Bi_x)_2B_3O_{10}$ (where A is a trivalent metal, B is a tetravalent metal, and 0<x<1).

10. The ferroelectric capacitor device of claim 9, wherein in the general formulae (8) and (9), A is a lanthanoide such as La, Ce, Pr, Nd, Pm, Sm, Eu, Gd, Tb, Dy, Ho, Er, Tm, Yb or Lu, and B is Ti.

11. The ferroelectric capacitor device of claim 9, wherein the probability of the first layer in the plurality of perovskite-like layers being represented by the general formula $BO_3$ is greater than 0 and smaller than 0.3.

12. A ferroelectric capacitor device comprising a bottom electrode, a capacitor insulating film formed of a ferroelectric film, and a top electrode, wherein the ferroelectric film has a bismuth layer structure including a plurality of bismuth oxide layers and a plurality of perovskite-like layers alternately put on top of each other, the plurality of bismuth oxide layers are formed of $Bi_2O_2$, and the plurality of perovskite-like layers include at least one first layer represented by general formula (10): $(A_{1-x}Bi_x)B_2O_7$ (where A is a trivalent metal, B is a tetravalent metal, and 0<x<1) and at least one second layer represented by general formula (11): $(A_{1-x}Bi_x)_2B_3O_{10}$ (where A is a trivalent metal, B is a tetravalent metal, and 0<x<1).

13. The ferroelectric capacitor device of claim 12, wherein in the general formulae (10) and (11), A is a lanthanoide such as La, Ce, Pr, Nd, Pm, Sm, Eu, Gd, Tb, Dy, Ho, Er, Tm, Yb or Lu, and B is Ti.

14. The ferroelectric capacitor device of claim 12, wherein the probability of the first layer in the plurality of perovskite-like layers being represented by the general formula $(A_{1-x}Bi_x)B_2O_7$ is greater than 0 and smaller than 0.3.

* * * * *